United States Patent
Kobayashi et al.

(10) Patent No.: US 7,105,409 B2
(45) Date of Patent: *Sep. 12, 2006

(54) SEMICONDUCTOR INTEGRATED CIRCUIT DEVICE AND PROCESS FOR PRODUCING THE SAME

(75) Inventors: Takashi Kobayashi, Tokorozawa (JP); Yasushi Goto, Kokubunji (JP); Tokuo Kure, Hinodemachi (JP); Hideaki Kurata, Kokubunji (JP); Hitoshi Kume, Musashino (JP); Katsutaka Kimura, Akishima (JP); Syunichi Saeki, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/899,119

(22) Filed: Jul. 27, 2004

(65) Prior Publication Data
US 2005/0014326 A1    Jan. 20, 2005

Related U.S. Application Data

(63) Continuation of application No. 10/031,117, filed as application No. PCT/JP00/06146 on Sep. 8, 2000, now Pat. No. 6,797,566.

(30) Foreign Application Priority Data
Sep. 10, 1999    (JP)    ................... 11-257990

(51) Int. Cl.
   *H01L 21/336*    (2006.01)
(52) U.S. Cl. .................. 438/266; 438/257; 438/262; 438/593
(58) Field of Classification Search ............... 438/266, 438/257, 593, 262
See application file for complete search history.

(56) References Cited

U.S. PATENT DOCUMENTS 4,849,369 A    7/1989    Jeuch et al. ............. 437/43

(Continued)

FOREIGN PATENT DOCUMENTS

JP    63-25979    2/1988

(Continued)

OTHER PUBLICATIONS

Kume, Hitoshi, "Flash Memory Technology," Ohyobutsuri, 65, No. 11, pp. 1114-1124, Nov. 10, 1996 (Japan Society of Applied Physics).

(Continued)

*Primary Examiner*—Michael Trinh
(74) *Attorney, Agent, or Firm*—Miles & Stockbridge P.C.

(57)    ABSTRACT

A semiconductor integrated circuit device with third gates comprising second conduction type source/drain diffusion layer regions 205 formed first conduction type well 201, floating gates 203b formed on semiconductor substrate 200 through an insulator film 202, control gates 211a formed on floating gates 203b through nitrogen-introduced silicon oxide film 210a and third gates 207a different from the floating gates and the control gates, formed through the semiconductor substrates, the floating gates, the control gates and the insulator film, where the third gates are formed as filled in gaps between the floating gates existing in a vertical direction to word lines and channels and the height of third gates 207a thus formed is made lower than that of floating gates 203b, has improved reduction of memory cell size and operating speed and improved reliability after programming/erasing cycles.

4 Claims, 23 Drawing Sheets

U.S. PATENT DOCUMENTS

| | | | |
|---|---|---|---|
| 5,541,130 A | 7/1996 | Ogura et al. | 437/43 |
| 5,555,520 A | 9/1996 | Sudo et al. | 365/14 |
| 5,614,747 A | 3/1997 | Ahn et al. | 257/316 |
| 5,654,917 A | 8/1997 | Ogura et al. | 365/185 |
| 5,672,892 A | 9/1997 | Ogura et al. | 257/314 |
| 5,681,770 A | 10/1997 | Ogura et al. | 437/43 |
| 5,682,055 A | 10/1997 | Huang et al. | 257/408 |
| 5,780,341 A | 7/1998 | Ogura | 438/259 |
| 6,034,894 A | 3/2000 | Maruyama et al. | 365/185.17 |
| 6,150,691 A | 11/2000 | Clampitt | 257/308 |
| 6,326,293 B1 | 12/2001 | Fang et al. | 438/597 |
| 6,438,028 B1 | 8/2002 | Kobayashi et al. | 365/185.05 |
| 6,687,156 B1 | 2/2004 | Kobayashi et al. | 365/185.05 |
| 6,797,566 B1 * | 9/2004 | Kobayashi et al. | 438/266 |

FOREIGN PATENT DOCUMENTS

| | | | |
|---|---|---|---|
| JP | 7-130884 | | 5/1995 |
| JP | 07-130884 | * | 5/1995 |
| JP | 8-340095 | | 12/1996 |
| JP | 9-116119 | | 5/1997 |
| JP | 9-321157 | | 12/1997 |
| JP | 11-220044 | | 8/1999 |

OTHER PUBLICATIONS

Naruke, K. et al., "A New Flash-Erase EEPROM Cell with a Sidewall Select-Gate on its Source Side", IEEE Technical Digest of International Electron Devices Meeting, 1989, pp. 603-606.

* cited by examiner (a)

(b)

(c)

(a)

(b)

(c)

(a)

(b)

(c)

SEMICONDUCTOR INTEGRATED CIRCUIT DEVICE AND PROCESS FOR PRODUCING THE SAME

CROSS-REFERENCE TO RELATED APPLICATION

This application is a continuation of application Ser. No. 10/031,117 filed Jan. 16, 2002 (now U.S. Pat. No. 6,797,566), which is a 371 of International Application No. PCT/JP00/06146 filed Sep. 8, 2000.

TECHNICAL FIELD

The present invention relates to a semiconductor integrated circuit device and a process for producing the same, and particularly to a technique of realizing integration, reliability improvement and low voltage operation at a high speed of a nonvolatile semiconductor memory device capable of electrically programming/erasing.

BACKGROUND ART

Among nonvolatile semiconductor memory devices capable of electrically programming/erasing, the so-called flash memory capable of bulk erasing is well known. Flash memory is distinguished in mobility and impact resistance and is capable of electrically conducting bulk erasing and thus is now in rapidly increasing demand as the file (memory device) of personal digital assistants such as mobile personal computers, digital still cameras, etc. Reduction in bit cost by reducing the memory cell area is an important factor in the market expansion. For example, as disclosed in Ohyobutsuri, 65, No. 11, 1114–1124, published by Japan Society of Applied Physics (Ohyobutsuri-Gakkai) on Nov. 10, 1996, various memory cell systems have been proposed for its realization.

On the other hand, Japanese Patent No. 2,694,618 (Reference 1) discloses a virtual ground type memory cell using three-layered polysilicon gates. That is, the memory cells each comprise a semiconductor region and three kinds of gates formed on a well in a semiconductor substrate. Three kind of gates are a floating gate formed on the well, a control gate formed on the floating gate and an erase gate formed between the adjacent control gate and floating gate. The three kinds of gates are made of polysilicon and isolated from one another by insulator films, respectively, and the floating gate and the well are also isolated from each other by another insulator film. The control gates are connected in the row direction (direction x) to form word lines. Source/drain diffusion layers are formed in the column direction as a virtual ground type, sharing with the adjacent memory cell and diffusion layer to attain pitch reduction in the column direction. The erase gates are arranged in parallel to channels and also in parallel to the word lines and between the word lines (control gates).

In the programming of the memory cells as described in Reference 1, a positive voltage is mutually independently applied to the word lines and the drains, whereas the well, the sources and the erase gates are maintained at zero (0) volt, whereby hot electrons are generated in the channel regions near the drains, and electrons are injected into the floating gates to elevate the threshold voltage of the memory cells. In the erasing, a positive voltage is applied to the erase gates, whereas the word lines, the sources and the well are maintained at zero (0) V, whereby electrons are emitted from the floating gates to the erase gates to lower the threshold voltage.

Furthermore, JP-A-9-321157 (Reference 2) discloses split gate type memory cells and proposes a method of elevating hot electron generation and injection efficiencies during the programming by making larger an overlapping between the diffusion layers and the floating gates, making higher the voltage of the diffusion layers than that of the floating gates and also applying a low voltage to the word lines.

Furthermore, Technical Digest of International Electron Devices Meeting (1989), pp 603–606 (Reference 3) discusses a method of controlling the voltage of floating gates and also controlling split channels by third gates other than the floating gates and control gates.

However, the present inventors have found that in the aforementioned memory cells there are several problems in case of highly integrated circuits. The following problems have been found by the present inventors, but the finding has been so far not particularly disclosed yet.

According to the art disclosed in Reference 1, the memory cells are in such a structure that the upper surfaces of third gates are made higher than the upper surfaces of floating gates. In such memory cell structure, the convex parts at the upper ends of floating gates are counterposed to the third gates through an interlayer dielectric film. When a voltage is applied to the third gates in this structure to conduct an erasing operation, the electric field of the interlayer dielectric film at the upper surfaces of the floating gates is locally enhanced to allow a tunnel current mainly therethrough. Thus, when the erasing operation is carried out in cycles, the interlayer dielectric film around the upper surfaces of the floating gates will be degraded and the charge injected in the floating gates will be leaked to the third gates, rendering retention of data difficult. Electrons are trapped in the interlayer dielectric film around the upper surfaces of the floating gates during cyclic erasing operation, thereby reducing the tunnel current and lowering the erasing speed.

The memory cells disclosed in Reference 1 are in a split channel type memory cell structure devoid of floating gates in parts of the channel regions. The split channels of the memory cells are controlled by controlling a control gate (word line) voltage on the split channels. Thus, the word lines have a split gate function. In programming date into the memory cells, it is necessary to elevate the hot electron generation and injection efficiencies. That is, it is effective for this purpose to increase the floating gate voltage, thereby extending the electric field in the vertical direction of the channel regions and lower the split gate voltage, thereby extending the electric field in the horizontal direction of the channel regions. However, in the memory cells disclosed in Reference 1, the split gate voltage is controlled by word line voltage, and thus the floating gate voltage and the split gate voltage cannot be independently controlled. That is, both floating gate voltage and split gate voltage must be controlled by the word line voltage and the electron generation and injection efficiencies cannot be elevated at the same time. Thus, in data programming, a very large quantity of channel current flows, as compared with the injection current, and no simultaneous programming of a plurality of memory cells can be carried out, resulting in failure to attain a high programming speed.

The aforementioned Reference 2 proposes a method of elevating the hot electron generation and injection efficiencies at the same time in the split channel type memory cells, but the proposed method has such a problem that overlapping between the diffusion layer and the floating gates is difficult to obtain due to reduction of memory cell size.

Furthermore, the aforementioned Reference 3 proposes a method of controlling the floating gate voltage by word lines and controlling the split channel by third gates other than the floating gates and control gates, but the proposed method does not take into consideration any issues on the reduction of memory cell size.

DISCLOSURE OF INVENTION

An object of the present invention is to provide a semiconductor integrated circuit device with a reliability improvement and higher programming/erasing speed and a process for producing the same.

The object, and other objects and novel features of the present invention will be apparent from the disclosure of the present specification which follows and the accompanying drawings.

Among the inventions to be disclosed herein, typical embodiments of the invention will be briefly summarized as follows.

A process for producing a semiconductor integrated circuit device according to the present invention comprises steps of forming, for example, a p-type (first conduction type) well in a silicon substrate; forming a floating gate pattern (first pattern) through a first insulator film; further forming n-type semiconductor regions to act as sources/drains, forming a second insulator film covering the first pattern, forming third gates in gaps formed in the first pattern and further forming control gates, where the height of the upper surfaces of the third gates thus formed is made lower than the upper surface of the first pattern.

Third gates can be formed by any one of a first method of forming a polysilicon film to completely fill the gaps and then dry etching the polysilicon film, a second method of forming a polysilicon film to completely fill the gaps and the polishing the polysilicon film by chemical mechanical polishing (CMP) followed by dry etching, and a third method of forming a polysilicon film to completely fill the gaps, then polishing the polycrystalline film by CMP, then oxidizing the surface of the polysilicon film and selectively removing the oxidized parts.

The third gates can be also formed by any one of a fourth method of forming a polysilicon film so as not to completely fill the gaps, then forming a photo resist film to fill the gaps and dry etching the photo resist film, a fifth method of forming a polysilicon film so as not to completely fill the gaps, then polishing the polysilicon film by CMP, forming a photo resist film to fill the gaps and dry etching the photo resist film and the polysilicon film and a sixth method of forming a polysilicon film so as not to completely fill the gaps, then depositing a silicon oxide film to fill the gaps, polishing the silicon oxide film and the polysilicon film by CMP, selectively removing the silicon oxide film in the gaps, forming a photo resist film to fill the gaps and dry etching the photo resist film and the polysilicon film.

In the fourth to sixth methods, etching conditions can be so selected that the photo resist film and the polysilicon film can be etched at substantially equal etching speeds.

The third gates can be also formed by a seventh method of forming a polysilicon film so as not to completely fill the gaps, then forming a silicon oxide film on the polysilicon film, polishing the silicon oxide film and the polysilicon film by CMP, dry etching the polysilicon film and removing the silicon oxide film.

In the fourth to seventh methods, the thickness of the polysilicon film can be made smaller than that of the first pattern to act as floating gates.

Furthermore, a process according to the present invention comprises forming, for example, a p-type (first conduction type) well in a silicon substrate, forming third gates on the silicon substrate, through a second insulator film, forming n-type (second conduction type) semiconductor regions to act as sources/drains in the well, forming a first insulator film covering the third gates, forming a first pattern to act as floating gates in gaps formed between the third gates, and further forming control gates, where the height of the upper surface of the third gate is made lower than that of the upper surface of the first pattern to act as the floating gates.

The first pattern can be formed by any one of a first method of forming a polysilicon film to completely fill the gaps and then dry etching the polysilicon film, a second method of forming a polysilicon film to completely fill the gaps and then polishing the polysilicon film by CMP, followed by dry etching, a third method of forming a polysilicon film so as not to completely the gaps and then polishing the polysilicon film by CMP, a fourth method of forming a polysilicon film so as not to fill the gaps, then forming a photo resist film to fill the gaps and dry etching the photo resist film and the polysilicon film, and a fifth method of forming a polysilicon film so as not to completely fill the gaps, then depositing a silicon oxide film to fill the gaps and polishing the silicon oxide film and the polysilicon film by CMP.

In the foregoing methods, the third gates can be formed as self-aligned to the floating gates, and also the floating gates can be formed as self-aligned to the third gates.

A semiconductor integrated circuit device according to the present invention comprises a first conduction type well formed on the main surface of a semiconductor substrate, second conduction type semiconductor regions formed in the well, first gates formed on the semiconductor substrate through a first insulator film, second gates formed on the first gates through a second insulator film and third gates formed through the first gates and a third insulator film. The third gates being formed to fill gaps formed between the first gates, where the height of the upper surfaces of the third gates is made lower than the height of the upper surfaces the first gates.

In that case, the third gates can be formed as gates having a function of controlling erase gates or split channels or as gates having both of these functions.

The third insulator film can be a nitrogen-introduced silicon oxide film.

Figure 1:
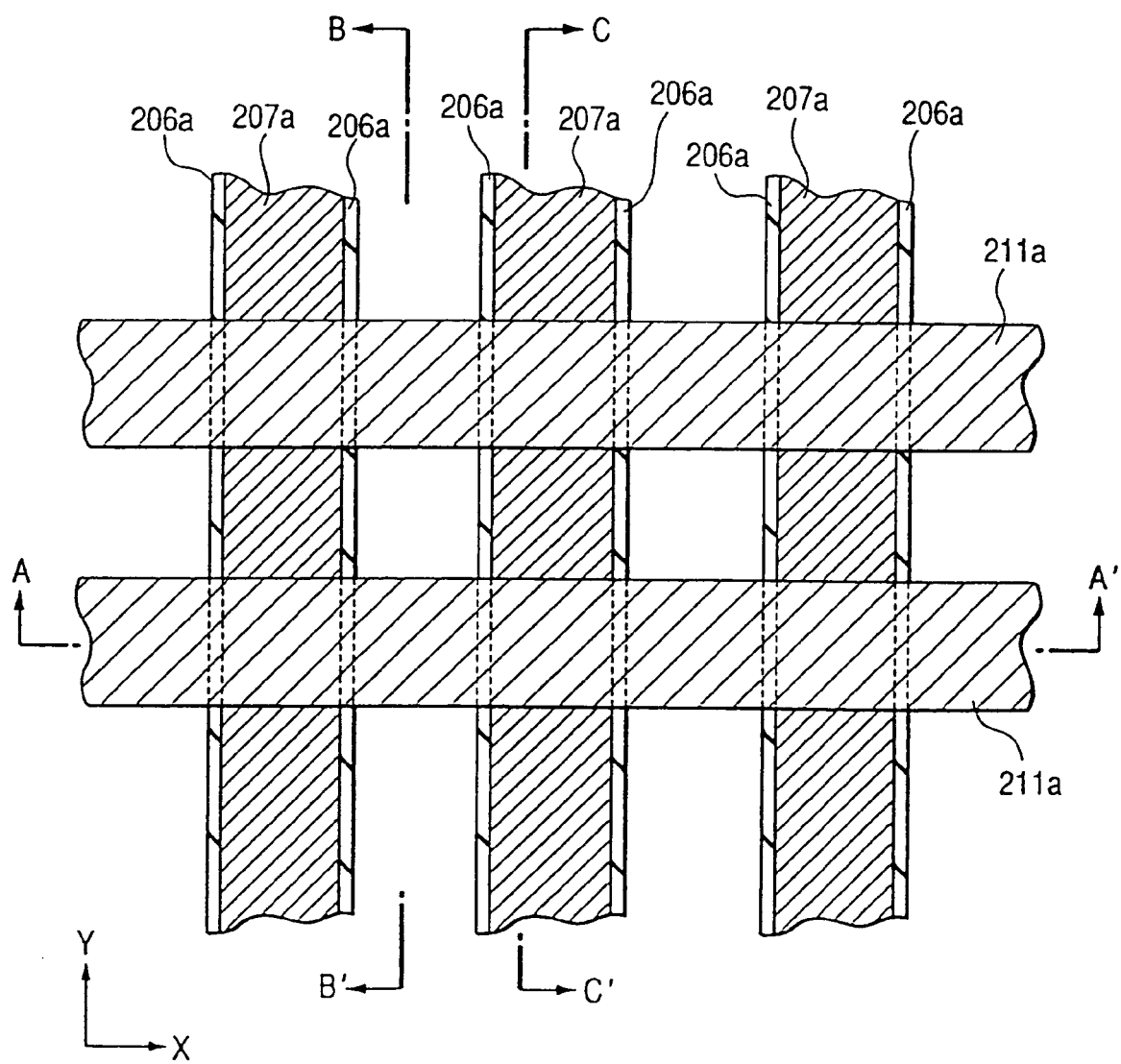
FIG. 1 is a plan view in part showing a semiconductor integrated circuit device according to Embodiment 1 of the present invention.
Figure 2:
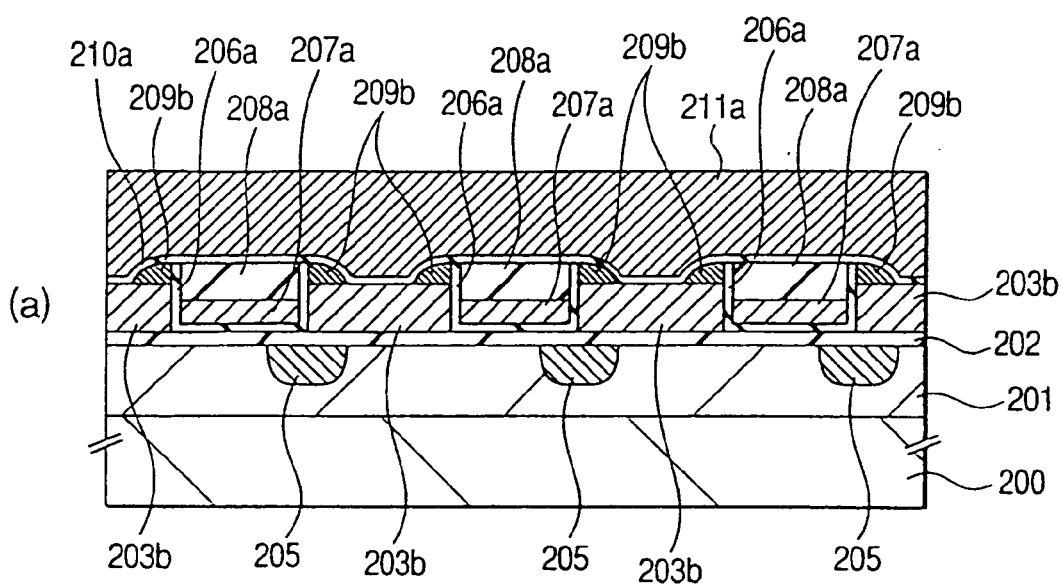
FIGS. 2(a), (b) and (c) are cross-sectional views along lines A–A', B–B' and C–C' in FIG. 1, respectively.
Figure 2:
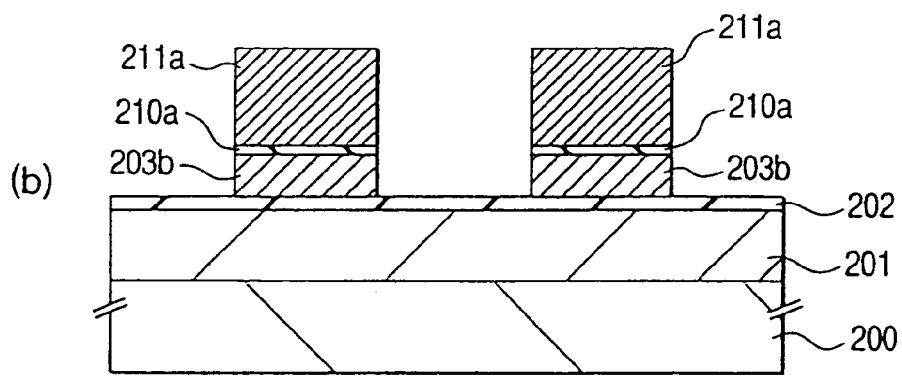
Figure 2:
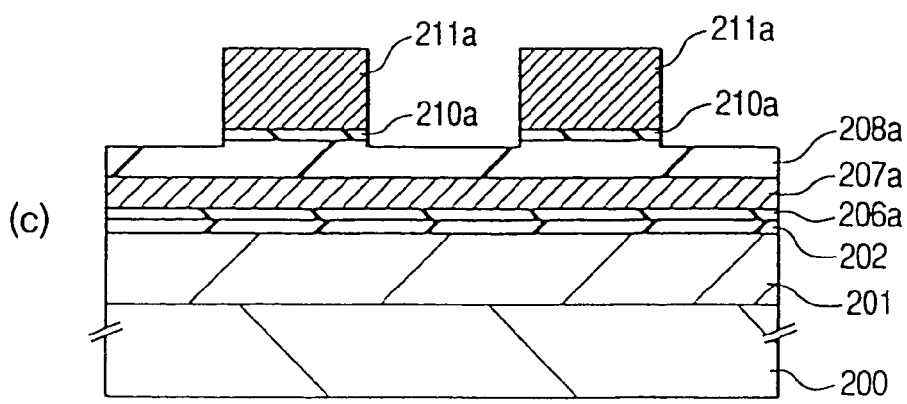

In the foregoing FIGS. 1 to 24, principal reference numerals used therein have the following meanings:

200, 300 and 400: semiconductor substrate (silicon substrate)

201, 301, and 401: well 202, 302 and 403: insulator film (gate oxide film)

402: isolation film 203, 203a, 203b, 209, 209a, 307, 307a, 307b, 308, 308a, 308b, 311, 311a, 404 and 404a: floating gate polysilicon film 204 and 204a: silicon nitride film 205, 305 and 405: diffusion layer region 206, 206a, 216b, 306 and 406: nitrogen-introduced silicon oxide film 207, 207a, 212, 212a, 214, 214', 214a, 214a', 214b, 216, 216a, 216b, 218, 218a, 218b, 219, 219a, 219b, 303, 303a, 410 and 410a: polysilicon film to act as third gates 208, 208a, 217, 217a, 217b, 217c, 220, 304 and 304a: silicon oxide film 210, 210a, 309, 309a and 408: nitrogen-introduced silicon oxide film 211, 211a, 310 and 409: polymetal film 211a, 310a and 409a: word line

BEST MODE FOR CARRYING OUT THE INVENTION

The present invention will be described in detail below, referring to embodiments of the present invention and drawings.

Throughout all the drawings showing embodiments of the present invention, members having the same functions are denoted by the same reference numerals and their repeated explanation will be omitted below.

EMBODIMENT 1

FIG. 1 is a plan view in part of a semiconductor integrated circuit device according to Embodiment 1 of the present invention, and FIGS. 2(a), (b) and (c) are cross-sectional views along lines A–A', B–B' and C–C' in FIG. 1, respectively. For easy understanding of the drawing individual members are hatched in the plan view of FIG. 1 and some members are omitted and not shown.

The semiconductor integrated circuit device according to Embodiment 1 of the present invention has so-called flash memory type memory cells, which comprise source/drain diffusion layers 205 in well 201 formed on the main surface of semiconductor substrate 200, first gates (floating gates) 203b, second gates (control gates) 211a and third gates 207a. Control gates (second gates) 211a of the respective memory cells are connected to one another in the row direction (direction x) to form word lines WL.

Floating gates (first gates) 203b and well 201 are isolated from one another by gate insulator film (first insulator film) 202; floating gates 203b and third gates 207a from one another by an insulator film (third insulator film) 206a; floating gates 203b and word lines (control gates) 211a from one another by an insulator film (second insulator film) 210a; and third gates 207a and word lines 211a from one another by an insulator film 208a.

Source/drain diffusion layers 205 are provided as extended in a vertical direction (direction y) to the direction (direction x) of extended word lines 211a and function as local source lines and local data lines, connecting sources/drains of the memory cells in the column direction (direction y). That is, the semiconductor integrated circuit device according to Embodiment 1 of the present invention is composed of so called contactless type array without contact holes in respective memory cells. Channels are formed in the vertical direction (direction x) to the diffusion layers 205.

Two side edges each of third gates 207a are counterposed to two of side edges of the floating gates 203b, which are vertical each to word lines 211*a* and channels through insulator films 206*a*, respectively.

Third gates 207*a* exist as filled in gaps formed between floating gates 203*b* present in the vertical direction (direction y) to word lines 211*a* and channels. Furthermore, floating gates 203*b* exist symmetrically to third gates 207*a* and third gates 207*a* exist symmetrically to floating gates 203*b*.

In Embodiment 1 of the present invention, a pair of diffusion layers 205, which form sources/drains, on the other hand, are at an asymmetrical position to floating gate pattern 203*b*, and one of the diffusion layers is in an offset structure which does not overlap with the floating gates. In Embodiment 1 of the present invention, some of third gates 207*a* and diffusion layers 205 overlap with each other, so that channels are formed in the well under third gates 207*a* in Embodiment 1 of the present invention and thus third gates 207*a* function not only as erase gates, but also as gates which control channels formed thereunder.

That is, in programming, a large positive voltage, e.g. about 12 V, is applied to the control gates, a low voltage, e.g. about 2 V, to the third gates and a voltage of about 5 V to the drains, whereas the sources and the well are maintained at zero (0) V, whereby channels are formed in the well under third gates 207*a* and hot electrons are generated in channels at edges of the floating gates on the source side and electrons are injected into the floating gates. That is, third gates 207*a* function as gates, which control channels formed thereunder. The present memory cells can improve hot electron generation and injection efficiencies, as compared with the conventional NOR type flash memory cells and can conduct programming in regions of small channel current. Thus, parallel programming of a large number of memory cells in order of kilobytes or more can be carried out with an internal voltage supply of same level of current drivability as that of prior art.

In erasing, a large negative voltage, e.g. −13.5 V, is applied to the word lines and a small positive voltage, e.g. 3.5 V, to the third gates, whereby a tunnel current is made to flow from the floating gates to the third gates, and the electrons injected in the floating gates are released. That is, third gates 207*a* function also as erase gates. In Embodiment 1 of the present invention, the upper surfaces of third gates 207*a* are positioned below the upper surfaces of floating gates 203*b*, whereby local increase in the electric field at the upper ends of the floating gates can be prevented during the erasing operation, and degradation of the interlayer dielectric film (insulator film 206*a*) can be suppressed after programming cycles, thereby assuring the reliability of memory cells.

In this structure, even if there are third gates 207*a* other than floating gates 203*b* and control gates 211*a*, pitch in the wordline (WL) direction (direction x) and in the local data line direction (direction y) can be made twice as large as the minimum feature size. Thus, the memory cell area can be reduced to minimum $4F^2$ (F: minimum feature size) in a cross-point type array.

Figure 3:
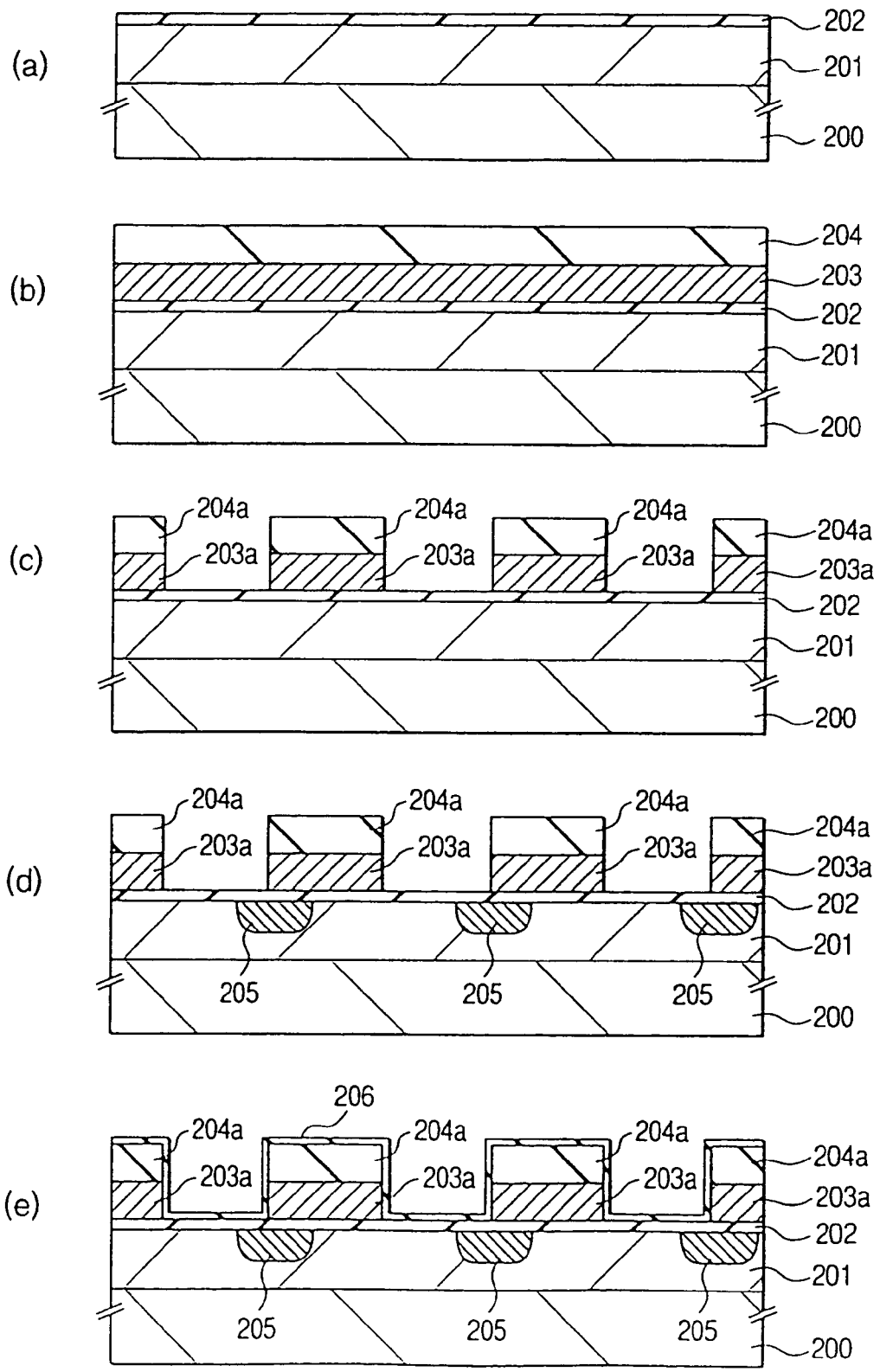
FIG. 3(a) to (e) cross-sectionally show steps of a process for producing a semiconductor integrated circuit device according to Embodiment 1 of the present invention.
Figure 4:
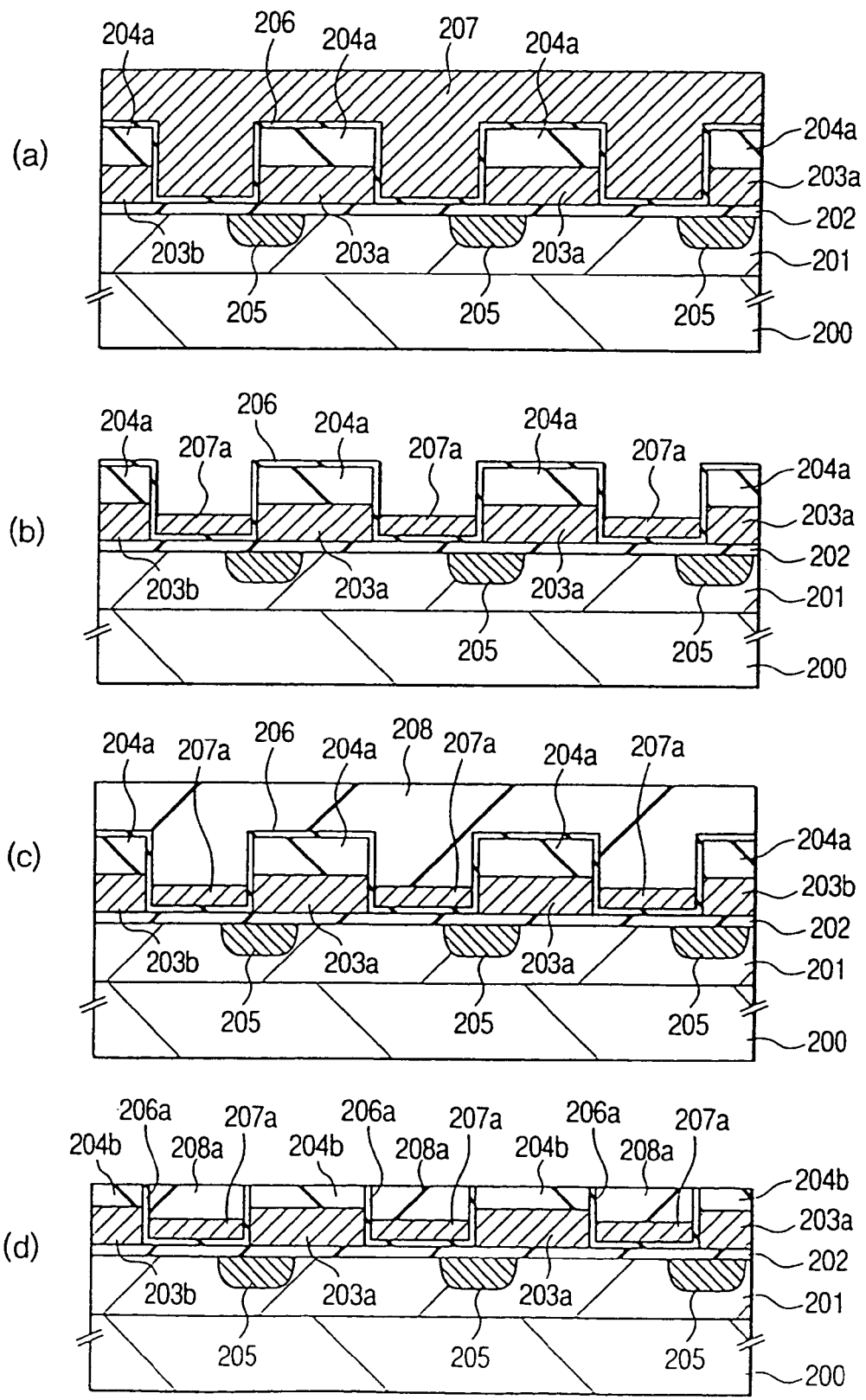
FIG. 4(a) to (d) cross-sectionally show further steps of the process for producing a semiconductor integrated circuit device according to Embodiment 1 of the present invention.
Figure 5:
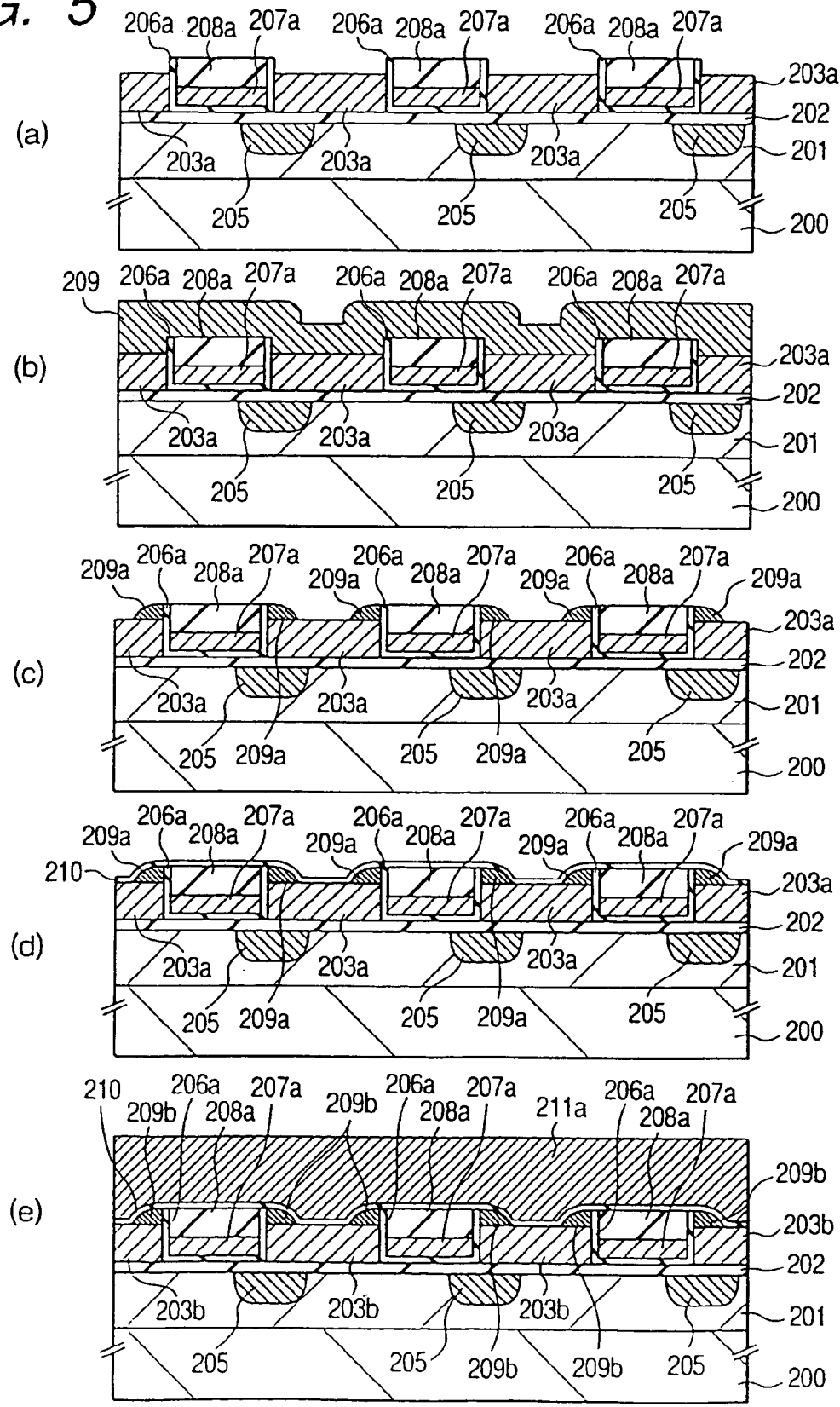
FIG. 5(a) to (e) cross-sectionally show still further steps of the process for producing a semiconductor integrated circuit device according to Embodiment 1 of the present invention.

FIGS. 3 to 5 cross-sectionally show steps of a process for producing a semiconductor integrated circuit device according to Embodiment 1 of the present invention.

At first, p-type (first conduction type) well 201 is formed in semiconductor substrate 200, and then gate insulator film (first insulator film) 202 is formed to a thickness at about 12 nm on well 201, for example, by a thermal oxidation [FIG. 3(*a*)].

Then, phosphorus (P)-doped polysilicon film 203 to act as floating gates 203*b* and silicon nitride film 204 are successively deposited thereon [FIG. 3(*b*)]. Deposition of polysilicon film 203 and silicon nitride film 204 can be carried out, for example, by CVD (chemical vapor deposition).

Then, said silicon nitride film 204 and polysilicon film 203 are patterned by lithography and dry etching. By the patterning, silicon nitride film 204 and polysilicon film 203 are made into silicon nitride films 204*a* and polysilicon films 203*a*, respectively [FIG. 3(*c*)]. Silicon nitride films 204*a* and polysilicon films 203*a* are formed in a stripe form by the patterning so that they are extended in the direction y.

Then, arsenic (As) ions are implanted into well 201 by titled ion implantation to form diffusion layers 205 to act as sources/drains of memory cells [FIG. 3(*d*)]. Diffusion layers 205 function as source lines or data lines of memory cells. In the ion implantation, silicon nitride films 204*a* and polysilicon films 203*a* function as masks, so that diffusion layers 205 are formed as self-aligned to polysilicon films 203*a*. Since silicon nitride films 204*a* and polysilicon films 203*a* are formed in a stripe form as extended in the direction y, diffusion layers 205 are also formed as extended in the direction y. Since diffusion layers are formed by the tilted ion implantation, implanted ions are shielded by silicon nitride film 204*a* and polysilicon film 203*a* and thus diffusion layers 205 are not formed in the entire regions between adjacent polysilicon films 203*a*. Since the ions are implanted in the tilted direction, diffusion layers 205 are formed also partly under polysilicon films 203*a*, whereby parts each of third gates 207*a* and diffusion layers 205 are formed as overlapped with one another, as mentioned before, and thus channels are formed in well 201 under third gates 207*a*.

Since the members etched in the etching step (i.e. silicon nitride films 204*a* and polysilicon films 203*a*) contain neither metal films nor metal compound materials, no metals are dissolved in a cleaning step following the etching step and no dissolved metals redeposit on walls of the etched members. Thus, no metals (impurities) are contained in silicon oxide film 206, which will be explained, referring to the next step, whereby defects of silicon oxide film 206 can be suppressed to minimum and the reliability can be improved.

Then, silicon oxide film 206 for isolating floating gates 203*b* from third gates 207*a* is formed in the following manner.

At first, the silicon oxide film is deposited to a thickness of about 10.5 nm by LPCVD (low pressure chemical vapor deposition) [FIG. 3(*e*)]. Then, the silicon oxide film is annealed in an ammonia atmosphere to introduce nitrogen into said silicon oxide film 206. Then, nitrogen-introduced silicon oxide film 206 is subjected to wet oxidation to remove hydrogen introduced into the silicon oxide film by annealing in ammonia.

Silicon oxide film 206 formed in the aforementioned manner has a small charge trapping and high programming/erasing endurance characteristics. That is, if the charge is trapped in silicon oxide film 206, the trapped charges are transferred in a nonbiased state to third gates. The larger the amount of transferred electrons, the higher the possibility to cause retention degradation. The amount of transferred electrons increase with trap density, and thus when the charge trapping is larger in silicon oxide film 206, probability to cause retention degradation will be increased. However in Embodiment 1 of the present invention, the charge trapping in the film is suppressed, the retention degradation will be suppressed and high programming/erasing endurance characteristics can be obtained. Furthermore, silicon oxide film 206 contains no metal impurities, as already mentioned above.

Then, phosphorus (P)-doped polysilicon film 207 to act as third gates 207a is deposited to completely fill gaps in floating gate pattern 203a [FIG. 4(a)]. The polysilicon film can be deposited, for example, by CVD.

Then, polysilicon film 207 is etched back, for example, by anisotropic dry etching, whereby third gates 207a were formed to a predetermined thickness as retained in the gaps in floating gate pattern 203a [FIG. 4(b)], where the thickness of retained polysilicon film (third gates 207a) following the etch back was made smaller than that of floating gate polysilicon 203a. Reliability of insulator film 206a for isolating floating gate polysilicon 203a from third gates 207a can be improved by forming third gates 207a of smaller thickness in this manner, whereby the retention degradation can be reduced as already mentioned above.

Then, silicon oxide film 208 is deposited to completely fill the gaps in floating gate pattern 203a [FIG. 4(c)]. Deposition of silicon oxide film is carried out, for example, by CVD.

Then, silicon oxide film 208 is polished, for example by CMP (chemical mechanical polishing) until silicon nitride films 204a are exposed (wherein silicon nitride films 204a and silicon oxide films 206 and 208 are made into silicon nitride films 204b, insulator films 206a and silicon oxide films 208a, respectively [FIG. 4(d)].

Then, silicon nitride films 204b are removed with a hot aqueous phosphoric acid solution to expose the surfaces of polysilicons 203a [FIG. 5(a)]. Then, phosphorus (P)-doped polysilicon film 209 is deposited [FIG. 5(b)] and subjected to anisotropic dry etching (whereby polysilicon film 209 are made into polysilicon films 209a) [FIG. 5(c)]. Polysilicon films 209a are electrically connected to polysilicon 203a, and the polysilicons of those two layers form floating gates polysilicons 209a are effective for increasing the surface area of floating gates, which results in and also increasing the coupling ratio of memory cells, whereby the internal operating voltage can be reduced during the programming/erasing.

Nitrogen-introduced silicon oxide film (film thickness: about 10.5 nm) 210 for isolating floating gates from word lines is formed in the same manner as shown in FIG. 3(e) [FIG. 5(d)].

Then, a stacked film of a polysilicon film, a tungsten nitride film and a tungsten film, i.e. so-called a polymetal film, is deposited and patterned by lithography and dry etching to form word lines 211a. The patterning is so carried out that word lines 211a are extended in the direction x, that is, in a vertical direction (direction x) to the direction of extended diffusion layers 205 and third gates 207a (direction y).

Furthermore, silicon oxide film 210 and polysilicon films 209a and 203a are etched to complete floating gates (whereby silicon oxide film 210 is made into 210a and polysilicons 203a and 209a are made into 203b and 209b, respectively) [FIG. 5(e)]. To etch silicon oxide film 210 in the etching step, etching is carried out under such conditions that only the silicon oxide film can be etched, whereas to etch polysilicon films 209a and 203a, etching is carried out under such selective etching conditions that silicon can be etched but no silicon oxide film is etched, where insulator films 208a as silicon oxide films function as an etching stopper, so that no third gates 207a under insulator films 208a are etched. That is, floating gates 203b are sectioned in both directions, i.e. direction x and direction y in the etching step to form island-form floating gates, while maintaining third gates 207 in a stripe form as extended in the direction y.

Then, an intermetal dielectric film is formed, and then contact holes are formed and connected with word lines 211a, source/drain diffusion layers 205, well 201 and third gates 207a, followed by deposition of a metal layer and patterning thereof to form wirings, thereby completing memory cells, though not shown in the drawing.

Figure 6:
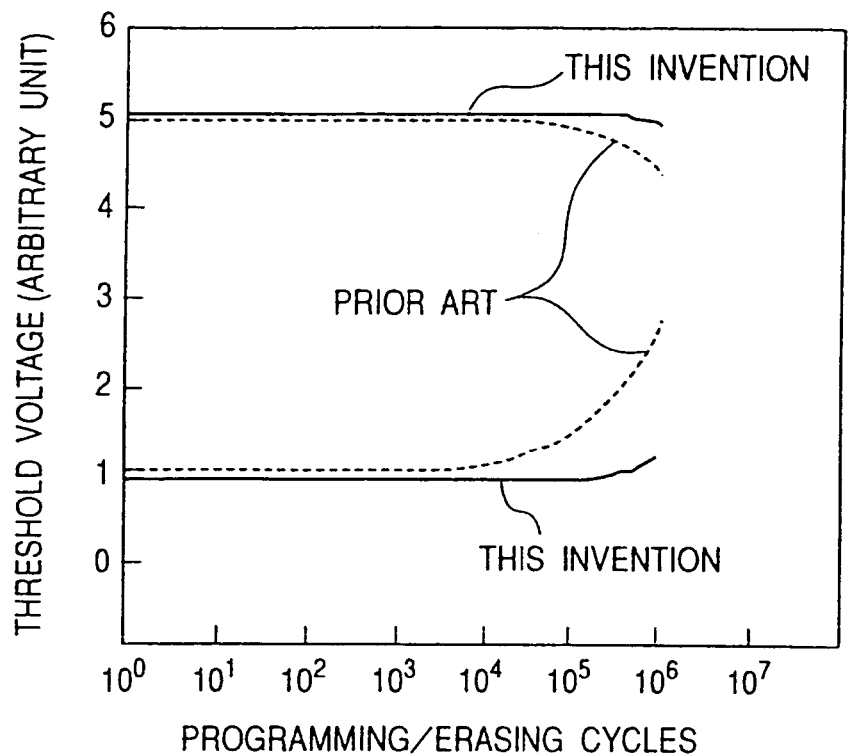
FIG. 6 is a graph showing relationships between programming/erasing cycles and threshold voltage when subjected to programming/erasing cycles.

FIG. 6 is a graph showing relationships between programming/erasing cycles and threshold voltage when the memory cells formed in the aforementioned manner are subjected to programming/erasing cycles, and also showing together the data as to the memory cells formed by the art of Reference 1 as prior art for comparison.

In the prior art, the erasing speed is lowered when the programming/erasing cycles exceeds about $10^4$, and the threshold voltage is narrowed presumably for the following reasons.

That is, in the prior art, the upper surfaces of the floating gates would be in a lower position than the upper surfaces of the third gates. When an erase voltage is applied to the third gates in memory cells of such a structure, lines of electric force would be concentrated in convex parts at the upper surfaces of the floating gates, and the electric field of the interlayer dielectric film, which performs insulation between polysilicon at the convex parts would be increased, as compared with the flat parts of side walls of floating gates. Thus, tunnel current would flow only through the convex parts at the upper surfaces of the floating gates, and as a result the interlayer dielectric film at the parts in contact with the convex parts would be degraded in less programming/erasing cycles and electrons would be trapped. The electric field applied to the interlayer dielectric film would be substantially reduced by such an electron trapping, so that the erasing speed would be lowered and the threshold voltage window would be narrowed.

In the memory cells according to Embodiment 1 of the present invention, on the other hand, the threshold voltage window is not substantially changed even after $10^6$ programming/erasing cycles, because the convex parts on the upper surfaces of floating gates 209a are in contact with thick oxide films 208a, and electron release takes place at the flat parts on side walls of floating gates 203b in case of erasing.

Figure 7:
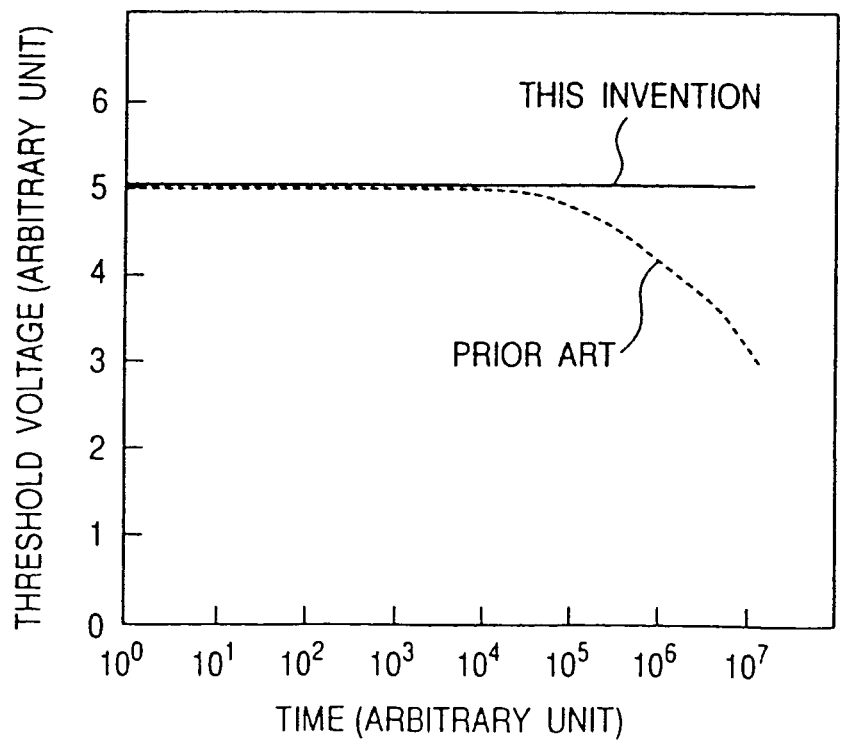
FIG. 7 is a graph showing results of measuring changes in threshold voltage when left standing after $10^6$ programming/erasing cycles.

FIG. 7 is a graph showing results of measuring changes in the threshold voltage when to the memory cells according to Embodiment 1 of the present invention are left standing after 106 programming/erasing cycles, and also shows results of prior art as measured in the same manner as already mentioned above.

In the prior art, it can be seen that the threshold voltage is largely lowered with increasing standing time, whereas in Embodiment 1 of the present invention no lowering of threshold voltage is observed, because the interlayer dielectric film between the polysilicon is less degraded in case of the memory cells according to Embodiment 1 of the present invention than in the prior art, and leakage of electrons injected into the floating gates to the third gates is suppressed.

Lower position of the upper surfaces of third gates than the position of the upper surfaces of floating gates is also effective for reduction of operating voltage.

Figure 8:
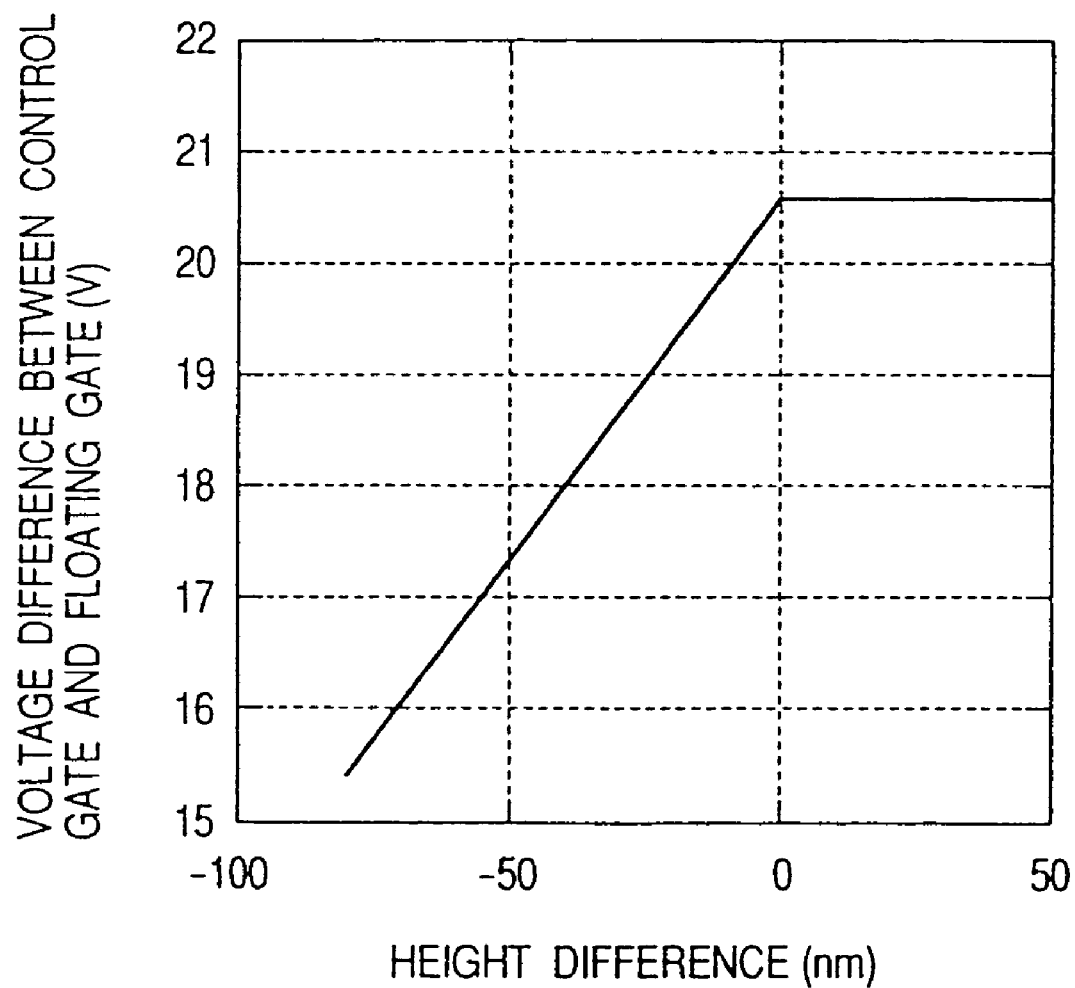
FIG. 8 is a graph showing relationships between a difference in height between the upper surfaces of floating gates and the upper surfaces of third gate and a difference in voltage between the control gates and the third gates, when the erasing operation is about to be completed after predetermined time.

FIG. 8 is a graph showing relationships between a difference in height between the upper surfaces of floating gates and the upper surfaces of third gates and a difference in voltage between the control gates and the third gates, when the erasing operation is about to be completed after predetermined cycles, where the thickness of floating gates is made constant, and a difference in height is made positive when the upper surfaces of third gates are in a higher position than that of the upper surfaces of floating gates, whereas a difference in height is made negative when the upper surfaces of third gates are in a lower position than that of the upper surfaces of floating gates. It can be seen from FIG. 8 that the voltage between the third gates and the control gates can be lowered and the more the operating voltage can be reduced by the lower the position of the upper surfaces of third gates than that of the upper surfaces of floating gates.

When the upper surfaces of third gates are in a higher position than that of the upper surfaces of floating gates, short circuit takes place between the word lines and the third gates, resulting in occurrence of such a failure of conducting desired memory cell operation, and such a failure can be suppressed by bringing the upper surfaces of third gates into a lower position than that of the upper surfaces of floating gates.

Though the memory cells formed in the foregoing manner have third gates other than floating gates and control gates, the dimensions in the direction of local data lines and in the direction of word lines can be made twice as large as their respective minimum feature sizes F, and thus the memory cell area can be reduced to $4F^2$.

EMBODIMENT 2

Figure 9:
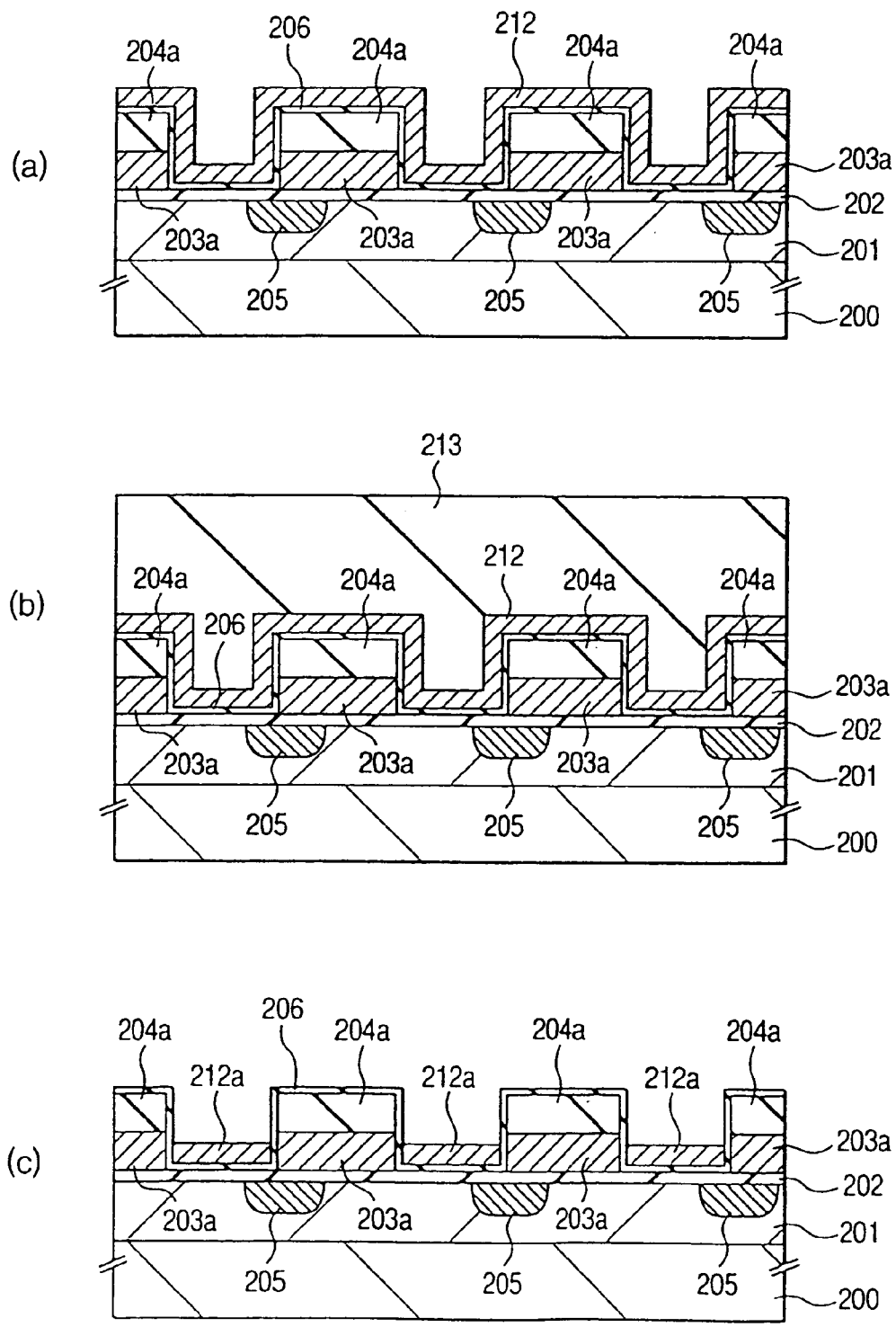
FIGS. 9(a)–(c) cross-sectionally show steps of a process for producing a semiconductor integrated circuit according to Embodiment 2 of the present invention.

FIG. 9 cross-sectionally shows steps of a process for producing a semiconductor integrated circuit device according Embodiment 2 of the present invention. Differences of the process according to Embodiment 2 from that of Embodiment 1 are in lower thickness of deposited polysilicon film to act as third gates than that of Embodiment 1, and coating of a photo resist onto the deposited polysilicon to fill the gaps in the floating gate pattern formed after the polysilicon film deposition, followed by etching back the photo resist and the polysilicon to act as third gates at approximately equal speeds, thereby leaving only polysilicon in the gaps in the floating gate pattern. Arrangement of flash memory cells in plan view, cross-sectional view of completed device and working system are the same as in Embodiment 1 and thus their explanation will be omitted below.

A process according to Embodiment 2 of the present invention will be described below. At first, well 201, gate oxide film 203, floating gate patterns 203a and 204a, diffusion layers 205 and nitrogen-introduced silicon oxide film 206 for isolating floating gates from third gates are successively formed on silicon substrate 200 in the same manner as shown in FIGS. 3(a)–(e) of Embodiment 1 (not shown in drawing).

Then, phosphorus-doped polysilicon film 212 to act as third gates is deposited thereon so as not to fill the gaps in floating gate patterns 203a and 204a [FIG. 9(a)]. Thickness of polysilicon film 212 can be made to correspond approximately to thickness of third gates after completion of memory cells.

Then, photo resist 213 is coated thereon to completely fill the gaps in floating gate patterns 203a and 204a [FIG. 9(b)]. Then, said photo resist 213 and polysilicon film 212 are etched back at approximately equal speeds to leave only polysilicon film 212 to a predetermined thickness in the gaps in floating gate patterns 203a and 204a (whereby polysilicon 212 is made into 212a) [FIG. 9(c)]. Time required for the complete removal of the photo resist is defined as an etching end point.

Then, silicon oxide films 208a, floating gate polysilicon films 209a as a second layer, nitrogen-introduced silicon oxide film 210 and word lines 211a made from a polymetal film are formed thereon in the same manner as in FIG. 4(c) to FIG. 5(e) of Embodiment 1 to complete memory cells.

Memory cells formed in the foregoing manner can reduce fluctuation in thickness of third gaps 212a, as compared with Embodiment 1. That is, polysilicon film 212 is formed as a film and thickness of the film can be made to correspond to thickness of third gates, making it easier to control the film thickness. In Embodiment 2 of the present invention, photo resist 213 with good fluidity is coated, and thus the surface flatness of photo resist 213 at the time of etch-back starting can be improved, resulting in improved flatness of third gates after the etch-back. Furthermore, in Embodiment 2 of the present invention, end point monitoring of etch-back can be more easily carried out by monitoring a plasma emission intensity from photo resist 213, resulting in easier control of thickness of third gates. Furthermore, in Embodiment 2 of the present invention, use of photo resist 213 eliminates void formation in the gaps, resulting in improved etch-back controllability and easier thickness control of third gates. In Embodiment 1, on the other hand, the third gates are formed by etch-back in time control, and thus the thickness control is more difficult to conduct than in Embodiment 2 of the present invention. Thus, in Embodiment 2 fluctuation in coupling ratio between memory cells can be reduced and programming/erasing time can be made uniform.

As in Embodiment 1, narrowing of threshold voltage window can be suppressed during the programming/erasing in Embodiment 2, as compared with the prior art. Furthermore, changes in threshold voltage after standing can be suppressed, and operation can be carried out with a lower voltage. Occurrence of short circuit between the erase gates and floating gates can be also suppressed and memory cell area can be reduced to $4F^2$. Furthermore, program size and programming speed can be increased.

EMBODIMENT 3

Figure 10:
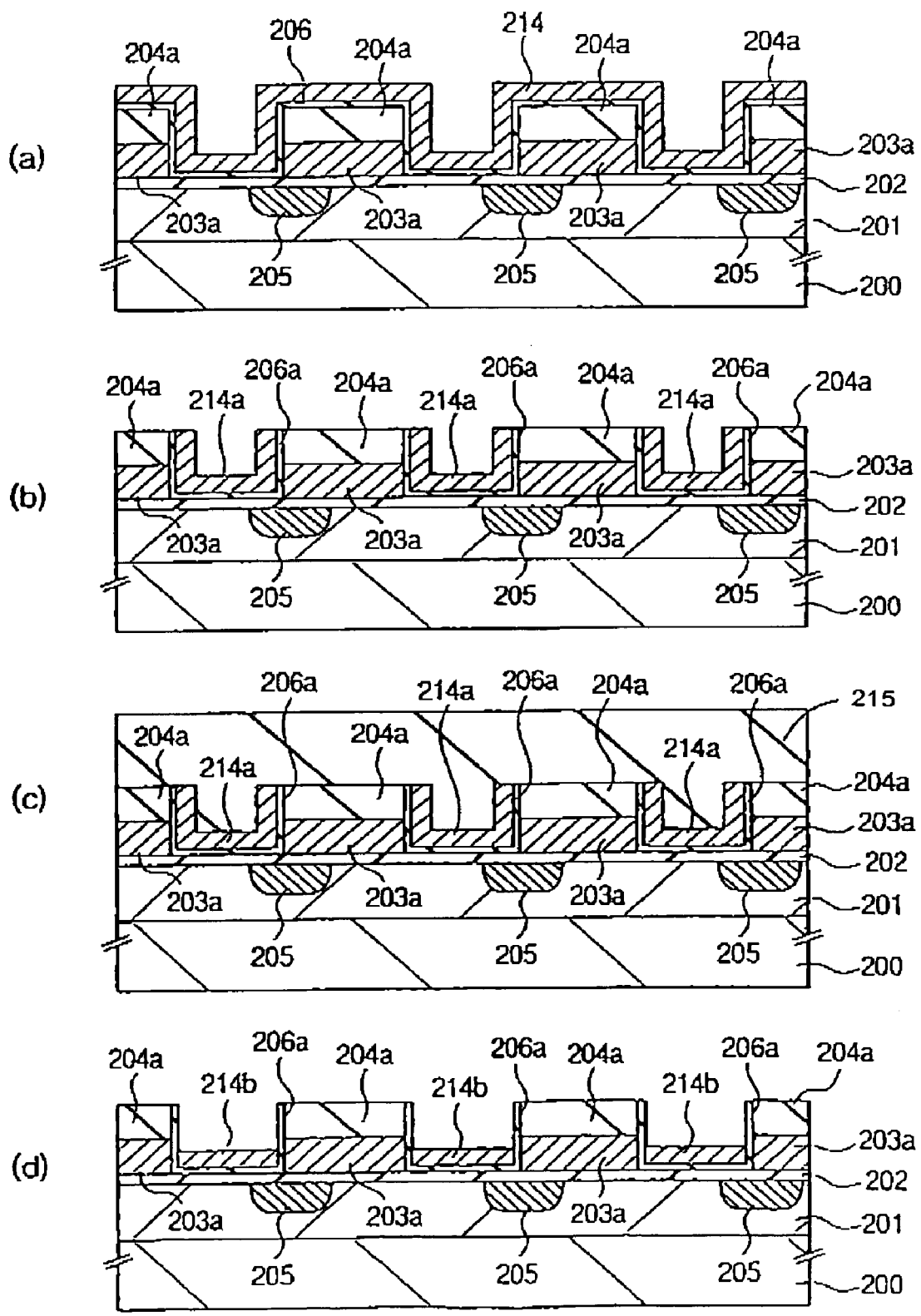
FIGS. 10(a)–(d) cross-sectionally show steps of a process for producing a semiconductor integrated circuit device according to Embodiment 3 of the present invention.

FIG. 10 cross-sectionally shows steps of a process for producing a semiconductor integrated circuit device according to Embodiment 3 of the present invention. A difference of the process according to Embodiment 3 of the present invention from that of Embodiment 2 is in removal of polysilicon film on the floating gate patterns by CMP (chemical mechanical polishing) after deposition of the polysilicon film to act as third gates and before photo resist coating and etch-back. Arrangement of flash memory cells in plan view, cross-sectional structure of completed device and working system are the same as in Embodiment 1 and thus their explanation will be omitted below.

A process for producing the present memory cells is as follow. Well 201, gate oxide film 202, floating gate patterns 203a and 204a, diffusion layer 205 and nitrogen-introduced silicon oxide film 206 for isolating floating gates from third gates are successively formed on silicon substrate 200 in the same manner as shown in FIGS. 3(a)–(e) of Embodiment 1 (not shown in drawing).

Then, phosphorus-doped polysilicon film 214 to act as third gates is deposited thereon so as not to fill the gaps in floating gate patterns 203a and 204a [FIG. 10(a)]. Thickness of polysilicon film 214 is made to correspond approximately to thickness of third gates of completed memory cells.

Then, said polysilicon film 214 is removed by polishing, i.e. by CMP until silicon nitride films 204a of floating gate pattern are exposed (whereby polysilicon film 214 and silicon oxide film 206 are made into 214a and 206a, respectively) [FIG. 10(b)].

Then, photo resist 215 is coated thereon to completely fill the gaps in floating gate patterns 203a and 204a [FIG. 10(c)]. Then, said photo resist 215 and polysilicon films 214a are etched back at approximately equal speeds to leave only polysilicon films 214a to a predetermined thickness in the gaps of floating gate patterns 203 and 204a (whereby polysilicon films 214a are made into 214b) [FIG. 10(a)]. Time required for complete removal of the photo resist is defined as an etching end point.

Then, silicon oxide films 208a, floating gate polysilicon films 209 as a second layer, nitrogen-introduced silicon oxide film 210 and word lines 211a made from a polymetal film are formed thereon in the same manner as shown in FIG. 4(c)–FIG. 5(e) of Embodiment 1 to complete memory cells.

The memory cells formed in the foregoing manner can much more reduce fluctuation in thickness of third gates 214b than in Embodiment 2. That is, in Embodiment 3, the upper surface of polysilicon film 214 is polished by CMP in advance, and thus an etching amount of polysilicon can be reduced, and as a result thickness of third gates 214b can be made smaller. That is, fluctuation in coupling ratio between the memory cells can be made lower, and programming/erasing time can be made uniform.

As in Embodiment 1, narrowing of threshold voltage window can be suppressed during the programming in Embodiment 3, as compared with the prior art. Furthermore, changes in threshold voltage after standing can be suppressed and operation can be carried out with a lower voltage. Occurrence of short circuit between the erase gates and the floating gates can be also suppressed and memory cell area can be reduced to $4F^2$. Furthermore, program size and programming speed can be increased.

Figure 11:
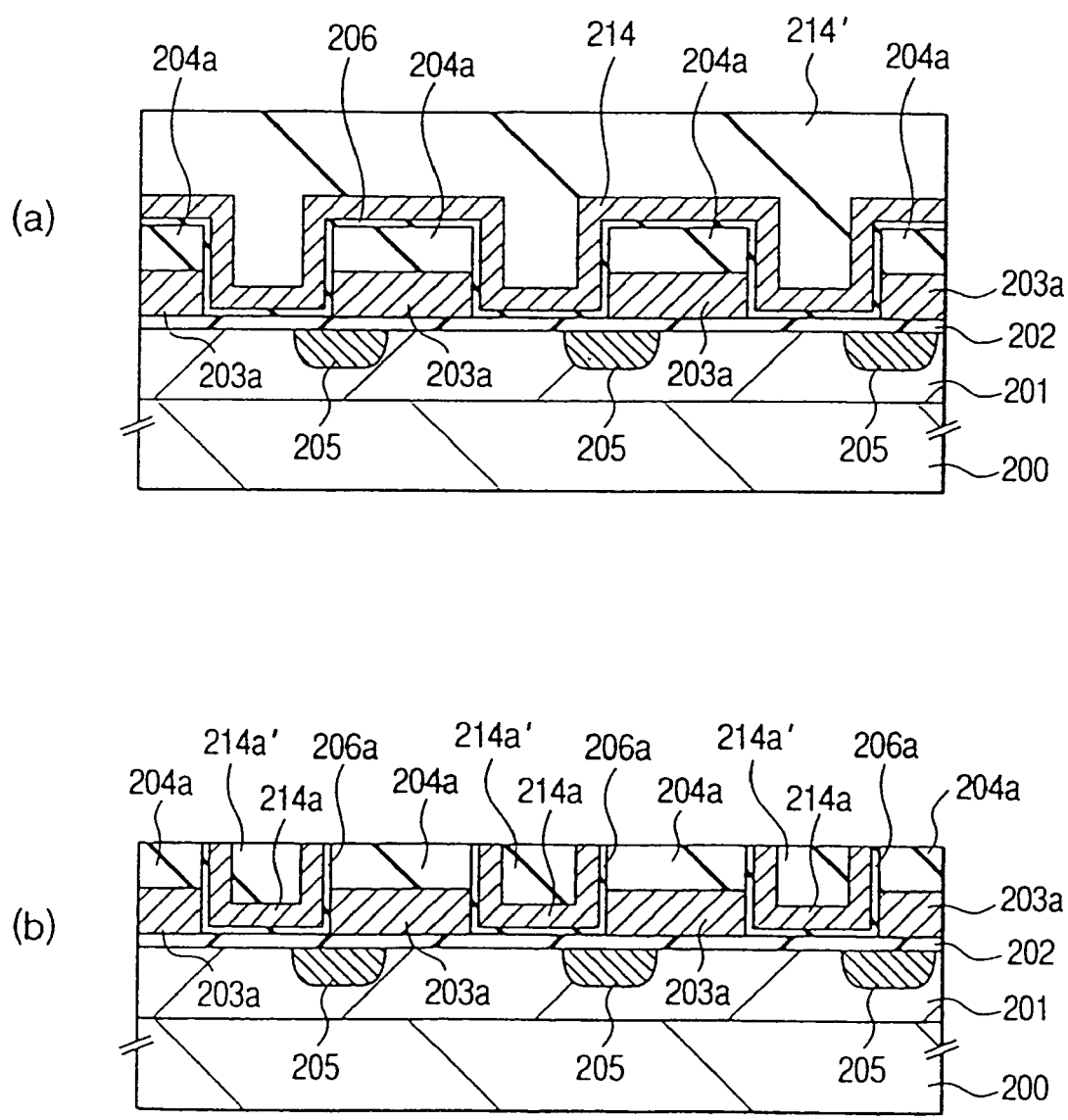
FIGS. 11(a) and (b) cross-sectionally show steps of another process for producing a semiconductor integrated circuit device according to Embodiment 3 of the present invention.

As shown in FIG. 11, silicon oxide film 214' (e.g. a TEOS oxide film, an SOG film, etc.) can be formed before polishing polysilicon film 214 by CMP [FIG. 11(a)], and said silicon oxide film 214' and polysilicon film 214 can be polished together by CMP (whereby silicon oxide film 214' is made into 214a') [FIG. 11(b)]. In that case, polysilicon film 214 never falls down inwardly into the gaps and is never damaged. Then, silicon oxide films 214a' are selectively removed, followed by steps of FIG. 10(b) et seq.

EMBODIMENT 4

Figure 12:
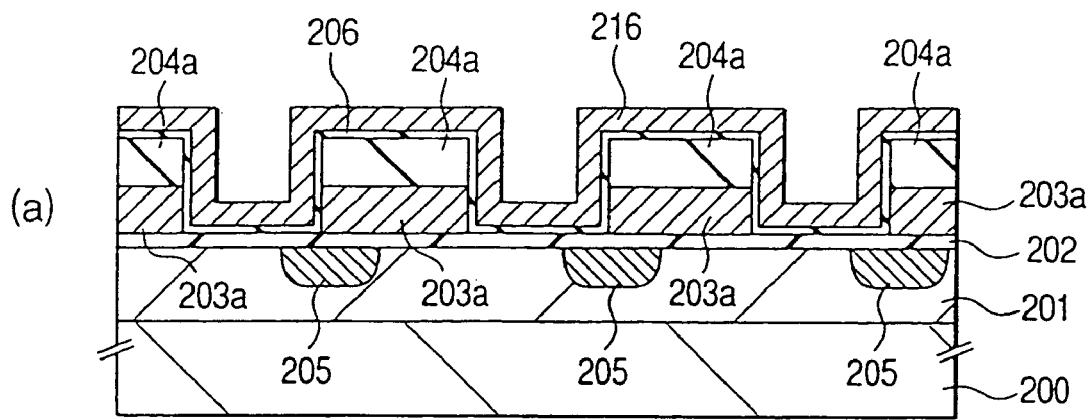
FIGS. 12(a)–(c) cross-sectionally show steps of a process for producing a semiconductor integrated circuit device according to Embodiment 4 of the present invention.
Figure 12:
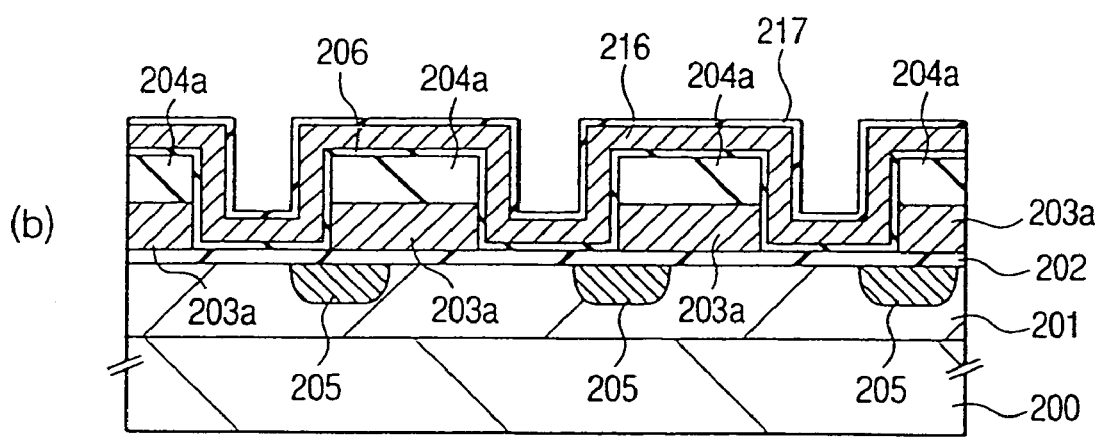
Figure 12:
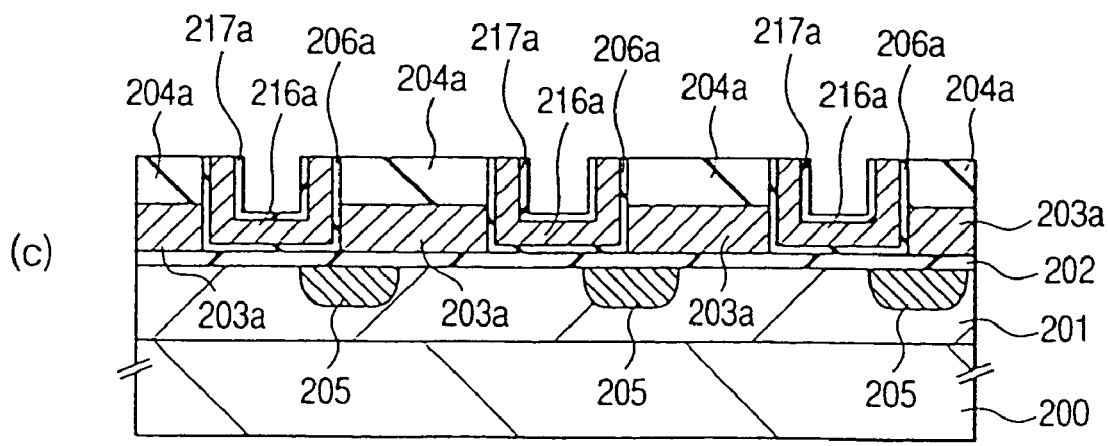
Figure 13:
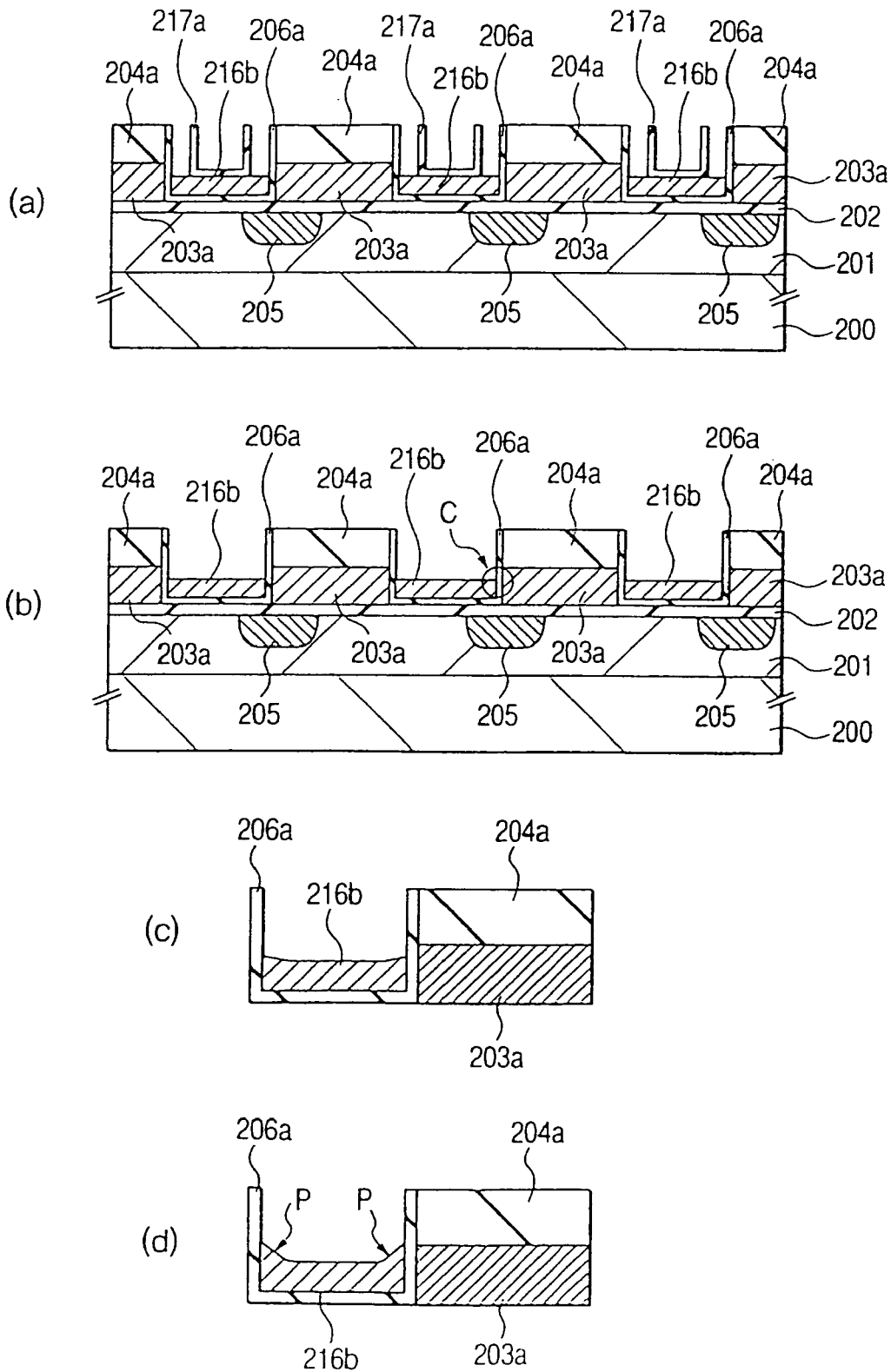
FIGS. 13(a) and (b) cross-sectionally show further steps of a process for producing a semiconductor integrated circuit device according to Embodiment 4 of the present invention.
FIG. 13(c) is a partially enlarged cross-sectional view around C in FIG. 13(b)
FIG. 13(d) is an enlarged view for comparison.

FIGS. 12 and 13 cross-sectionally show steps of a process for producing a semiconductor integrated circuit device according to Embodiment 4 of the present invention. A difference of the process of Embodiment 4 from that of Embodiment 2 is in formation of a silicon oxide film after deposition of a polysilicon film to act as third gates and its use as a protection film for etch-back. Arrangement of flash memory cells in plan view, cross-sectional structure of completed device and working system are the same as in Embodiment 1 and thus their explanation will be omitted below.

At first, well 201, gate oxide film 202, floating gate patterns 203a and 204a, diffusion layers 205 and nitrogen-introduced silicon oxide film 206 for isolating floating gates from third gates are successively formed on silicon substrate 200 in the same manner as shown in FIGS. 3(a)–(e) of Embodiment 1 (not shown in drawing).

Then, phosphorus-doped polysilicon film 216 to act as third gates is deposited thereon so as not to completely fill the gaps in floating gate patterns 203a and 204a [FIG. 12(a)]. Thickness of polysilicon film 216 is made approximately to correspond to the thickness of third gates of completed memory cells.

Then, silicon oxide film 217 to act as a protection film when polysilicon film 216 is to be etched back is formed thereon [FIG. 12(b)].

Then, said polysilicon film 216 and silicon oxide film 217 are removed by polishing, i.e. CMP, until silicon nitride films 204a of floating gate pattern are exposed (whereby polysilicon film 216, and silicon oxide films 206 and 217 are made into 216a, 206a and 217a, respectively) [FIG. 12(c)].

Then, polysilicon films 216a is etched back to leave polysilicon films 216a to a predetermined thickness in the gaps in floating gate patterns 203a and 204a (whereby polysilicon 216a are made into 216b) [FIG. 13(a)].

Then, silicon oxide films 217a retained in the gaps in floating gate patterns 203a and. 204a are removed by wet etching [FIG. 13(b)].

Then, silicon oxide films 208a, floating gate polysilicon films 209a as a second layer, nitrogen-introduced silicon oxide film 210 and word lines 211a made from a polymetal film are formed in the same manner as shown in FIG. 4(c)–FIG. 5(e) of Embodiment 1 to complete memory cells.

As in Embodiments 1 to 3, memory cells formed in Embodiment 4 can suppress narrowing of threshold voltage window during the programming, as compared with the prior art. Furthermore, changes in threshold voltage after standing can be suppressed and operation can be carried out with a lower voltage. Occurrence of short circuit between the erase gates and the floating gates can be also suppressed and memory cell area can be reduced to $4F^2$. Furthermore, program size and programming speed can be increased.

In Embodiment 4, since silicon oxide films 217a are formed in the central regions where third gates 216b are in a finished state, side wall regions of silicon oxide films 217a, as not covered silicon oxide films 217a (both end regions of third gates 216b) are selectively etched. Thus, cross-section of both etched end regions can be made into a sufficiently flat shape even in the side wall regions in the finished state of third gates 216b [FIG. 13(c)]. That is, the etching speed of the side wall regions is lower in the ordinary etching, and thus the side wall regions are etched into a shape with sharp projection P in the side wall regions [FIG. 13(d)].

In Embodiment 4, silicon oxide films 217a to act as a mask are formed in the central regions, as already mentioned before, no such shape is formed. Thus, the height of third gates 216b can be surely made lower than that of floating gates 203a, and the object of the present invention can be attained successfully.

Figure 14:
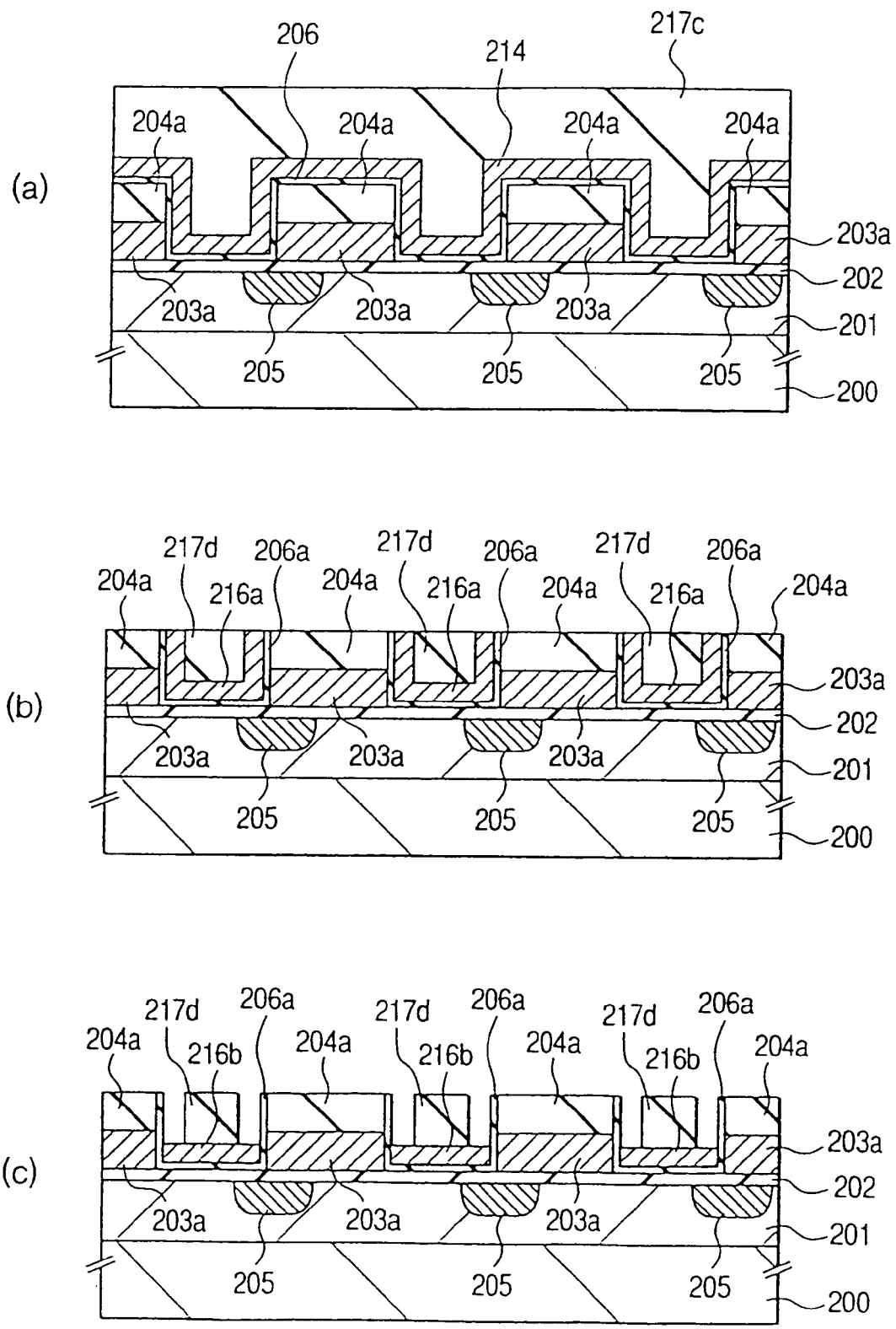
FIGS. 14(a)–(c) cross-sectionally show steps of another process for producing a semiconductor integrated circuit device according to Embodiment 4 of the present invention.

As shown in FIG. 14, thick silicon oxide films 217c may be formed to fill the gaps in place of silicon oxide film 217 [FIG. 14(a)]. Then, silicon oxide film 217c and polysilicon film 216 are polished by CMP [FIG. 14(b)], whereby silicon oxide film 217c is made into silicon oxide films 217d, and polysilicon film 216 is made into polysilicon films 216a). Then, polysilicon films 216a are etched back in the same manner as mentioned above, to leave polysilicon films 216a to a predetermined thickness in the gaps in floating gate patterns 203a and 204a (whereby polysilicon films 217d are made into 216b) [FIG. 14(c)]. Then, silicon oxide films 217d are removed, followed by steps of FIG. 13(b) et seq. In that case, falling-down of polysilicon film 216 inwardly into the gaps by CMP and the resulting damages can be prevented.

EMBODIMENT 5

Figure 15:
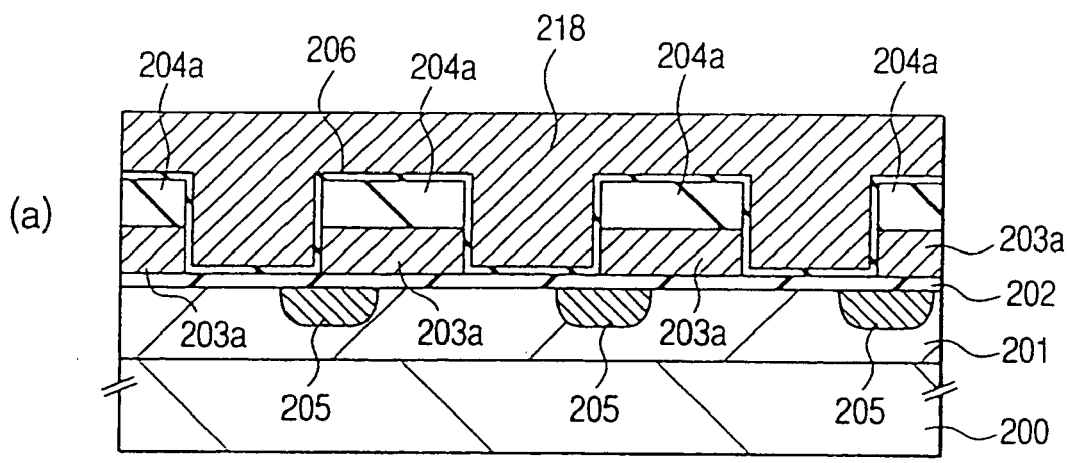
FIGS. 15(a)–(c) cross-sectionally show steps of a process for producing a semiconductor integrated circuit device according to Embodiment 5 of the present invention.
Figure 15:
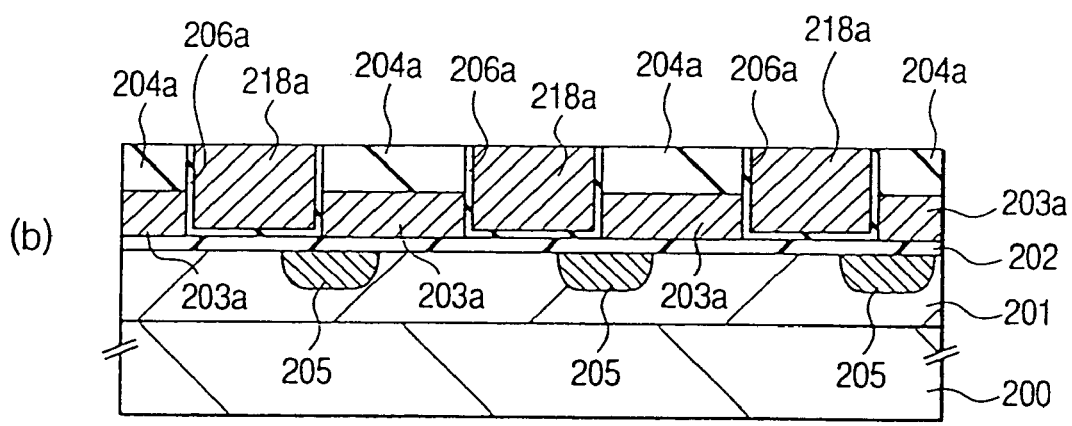
Figure 15:
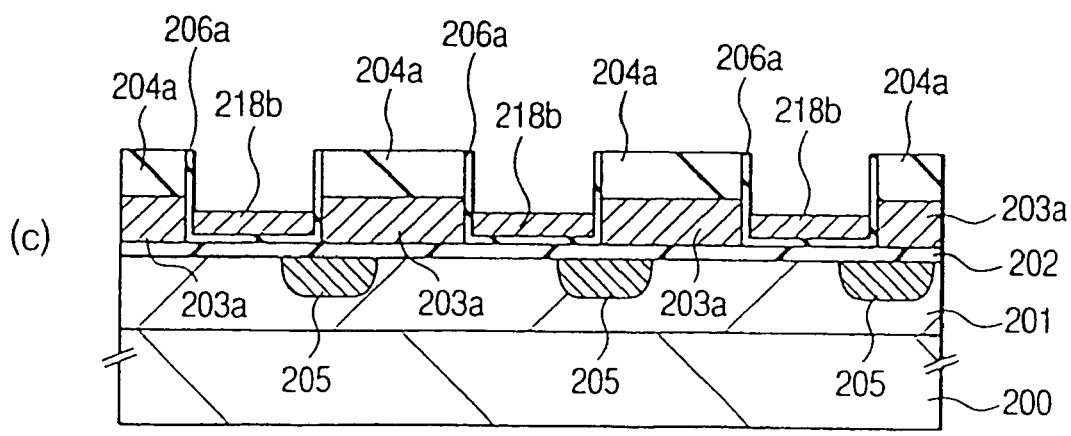

FIG. 15 cross-sectionally shows steps of a process for producing a semiconductor integrated circuit device according to Embodiment 5 of the present invention. In Embodiment 5, chemical mechanical polishing and etching-back by dry etching are used together to process the polysilicon film to act as third gates. Arrangement of flash memory cells in plan view, cross-sectional structure of completed device and working system are the same in Embodiment 1 and thus their explanation will be omitted below.

At first, well 201, gate oxide film 202, floating gate patterns 203a and 204a, diffusion layers 205 and nitrogen-introduced silicon oxide film 206 for isolating floating gates for third gates are successively formed on silicon substrate 200 in the same manner as shown in FIGS. 3(a)–(e) of Embodiment 1 (not shown in drawing).

Then, phosphorus-doped polysilicon film 218 to act as third gates is deposited thereon to completely fill the gaps in floating gate patterns 203a and 204a [FIG. 15(a)].

Then, said polysilicon film 218 is removed by polishing, i.e. CMP, until silicon nitride film 204a of floating gate pattern are exposed (whereby polysilicon film 218 and silicon oxide film 206 are made into 218a and 206a, respectively) [FIG. 15(b)].

Then, polysilicon films 218a are etched back to leave polysilicon films 218a to a predetermined thickness in the gaps in floating gate patterns 203a and 204a (whereby polysilicons 218a are made into 218b) [FIG. 15(c)].

Then, silicon oxide-films 208a, floating gate polysilicon films 209a as a second layer, nitrogen-introduced silicon oxide film 210 and word lines 211a made from a polymetal film are successively formed thereon in the same manner as in FIG. 4(c) to FIG. 5(e) of Embodiment 1 to complete memory cells.

As in Embodiments 1 to 4, memory cells formed in Embodiment 5 can suppress narrowing of threshold voltage window during the programming, as compared with the prior art. Furthermore, changes in threshold voltage after standing can be suppressed and operation can be carried out with a lower voltage. Occurrence of short circuit between the third gates and the floating gates can be also suppressed and memory cell area can be reduced to $4F^2$. Furthermore program size and programming speed can be increased.

In the process of Embodiment 5, polysilicon film 218 is polished as shown in FIG. 15(b), and thus the surface is flattened. An amount of polysilicon to be removed by successive etching-back can be reduced and thus load in the etching-back step can be reduced. Furthermore, etching is carried out after the flattening, and thus the surface of polysilicon films 218b can be easily made flat.

EMBODIMENT 6

Figure 16:
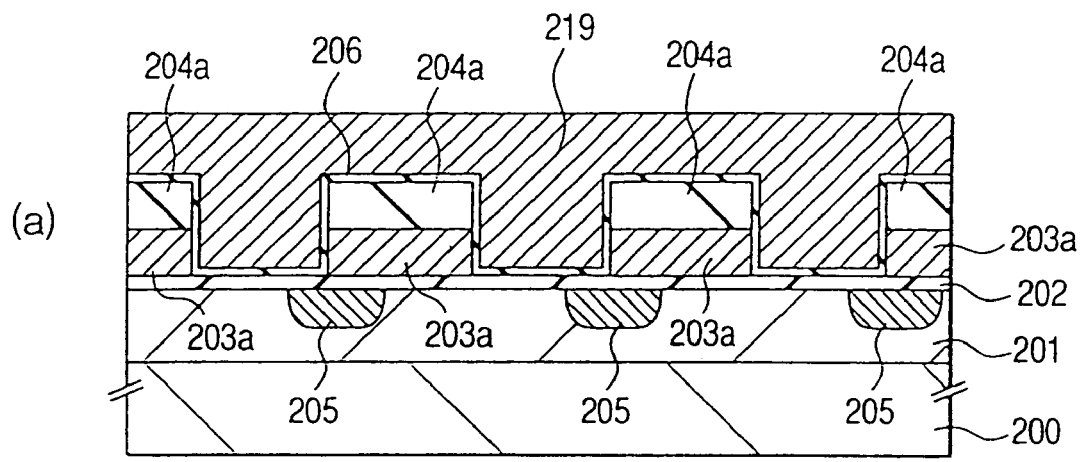
FIGS. 16(a)–(c) cross-sectionally show steps of a process for producing a semiconductor integrated circuit device according to Embodiment 6 of the present invention.
Figure 16:
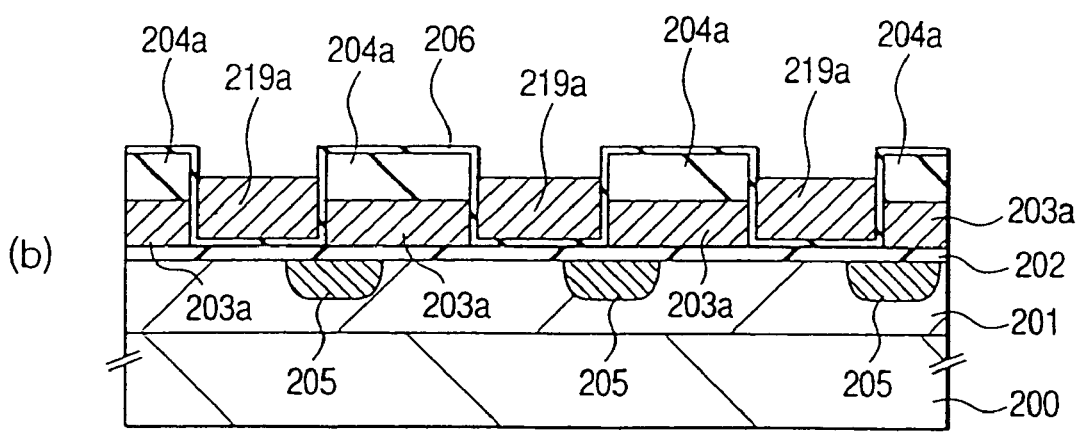
Figure 16:
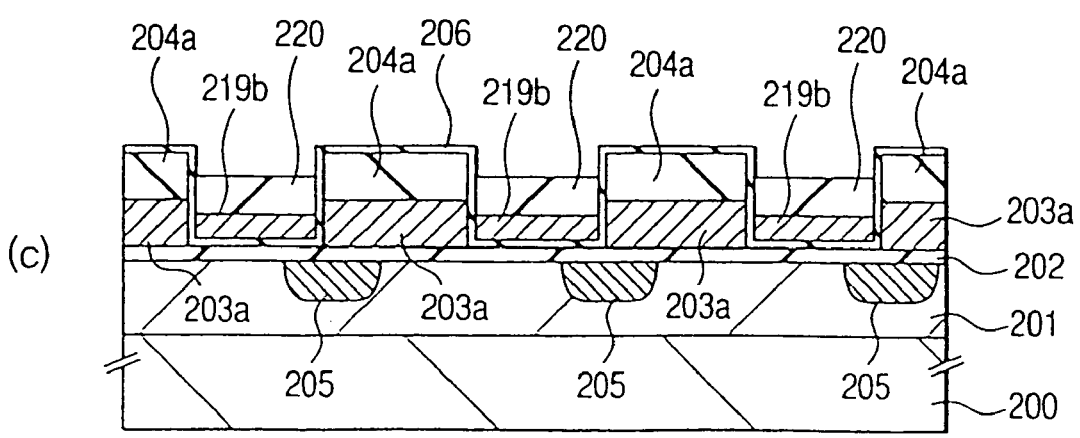
Figure 17:
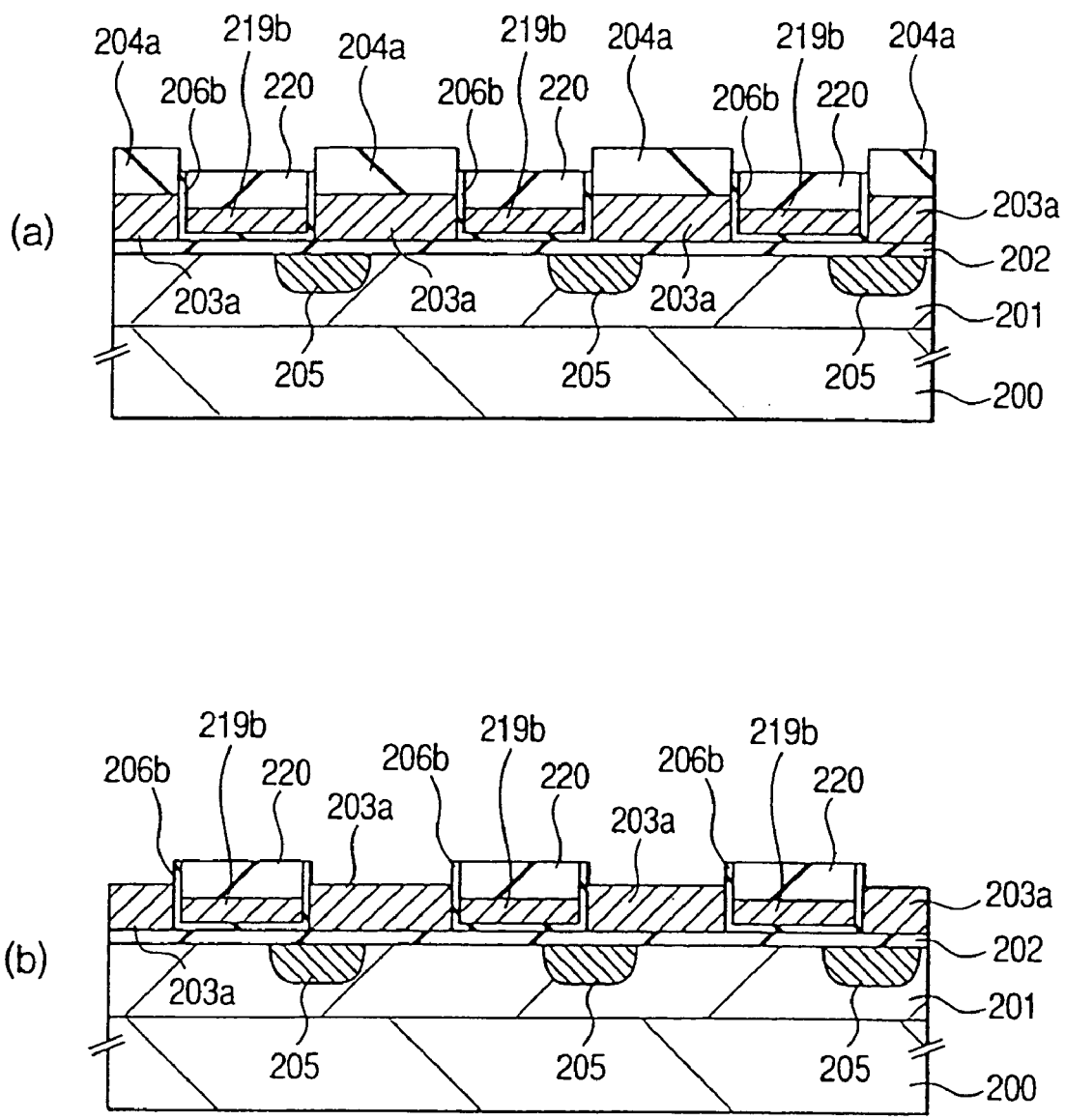
FIGS. 17(a) and (b) cross-sectionally show further steps of a process for producing a semiconductor integrated circuit device according to Embodiment 6 of the present invention.

FIGS. 16 and 17 cross-sectionally show steps of a process for producing a semiconductor integrated circuit device according to Embodiment 6 of the present invention. Difference of Embodiment 6 from Embodiments 1–5 is in adjustment of the height of the upper surface of polysilicon film to act as third gates by thermal oxidation. Arrangement of flash memory cells in plan view, cross-sectional structure of completed device and working system are the same as in Embodiment 1 and thus their explanation will be omitted below.

At first, well 201, gate oxide film 202, floating gate patterns 203a and 204a, diffusion layers 205 and nitrogen-introduced silicon oxide film 206 for isolating floating gates from third gates are successively formed on silicon substrate 200 in the same manner as shown in FIGS. 3(a)–(e) of Embodiment 1 (not shown in drawing).

Then, phosphorus-doped polysilicon film 219 to act as third gates are deposited thereon to completely fill the gaps in floating gate patterns 203a and 204a [FIG. 16(a)].

Then, polysilicon film 219 is etched back by anisotropic dry etching to leave the film in the gap in floating gate patterns 203a (whereby polysilicon 219 is made into 219a) [FIG. 16(b)].

Then, silicon oxide film 220 is formed on the surfaces of polysilicon films 219a by thermal oxidation to bring the upper surfaces of polysilicons 219a into a desired position lower than floating gate polysilicon 203a (whereby polysilicon 219a are made into 219b) [FIG. 16(c)], where nitrogen in silicon oxide film 206 is advantageously effective for suppressing oxidation of side walls of floating gate polysilicon 203a.

Then, silicon oxide film 206 present on the upper surfaces of silicon nitride film patterns 204a is removed by an aqueous hydrofluoric acid solution (whereby silicon oxide film is made into 206b) [FIG. 17(a)].

Then, silicon nitride films 204 are removed by a hot aqueous phosphoric acid solution to expose the surfaces of polysilicons 203a [FIG. 17(b)].

The successive steps are the same as those of FIG. 5(b) et seq. of Embodiment 1.

In Embodiment 6, fluctuation in thickness of third gates 219b can be reduced, as compared with Embodiments 1 to 5. That is, in the etch-back step of FIG. 16(b), the surfaces of polysilicon films 219a formed in the gaps between the floating gates can be obtained in a relatively shallow position, and thus can be made flat. Furthermore, silicon oxide film 220 is formed by thermal oxidation, and thus its thickness control can be made more easily. Thus, third gates 219b can be formed under good controllability, so that function in the thickness can be controlled. As a result, fluctuation in coupling ratio between the memory cells can be reduced and programming/erasing time can be made uniform.

As in Embodiment 1, narrowing of threshold voltage window can be suppressed during the programming in Embodiment 6, as compared with the prior art. Furthermore, changes in threshold voltage after standing can be suppressed and operation can be carried out with a lower voltage. Occurrence of short circuit between the erase gates and the floating gates can be also suppressed and memory cell area can be reduced to $4F^2$. Furthermore, program size and programming speed can be increased.

EMBODIMENT 7

Figure 18:
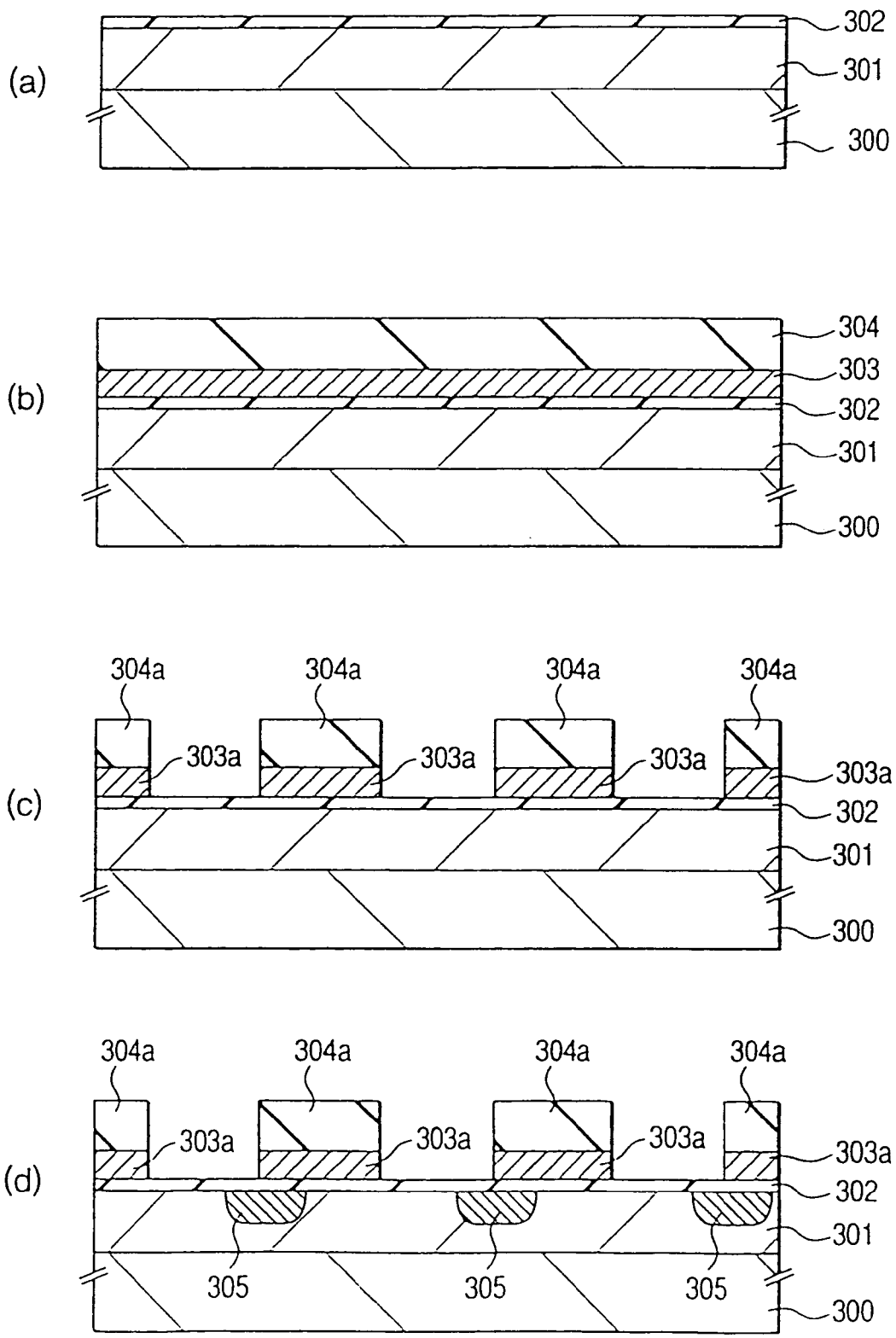
FIGS. 18(a)–(d) cross-sectionally show steps of a process for producing a semiconductor integrated circuit device according to Embodiment 7 of the present invention.
Figure 19:
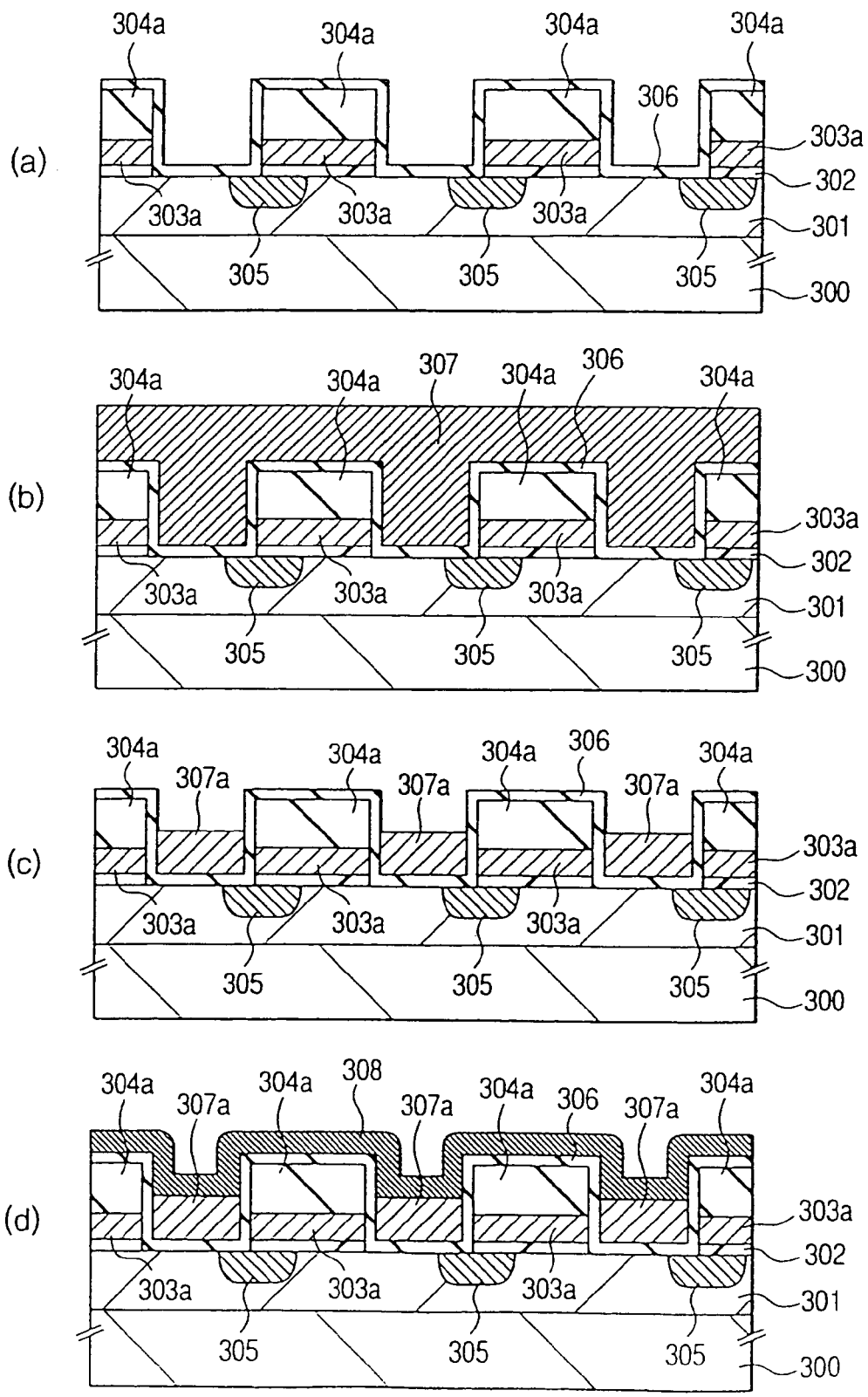
FIGS. 19(a)–(d) cross-sectionally show further steps of a process for producing a semiconductor integrated circuit device according to Embodiment 7 of the present invention.
Figure 20:
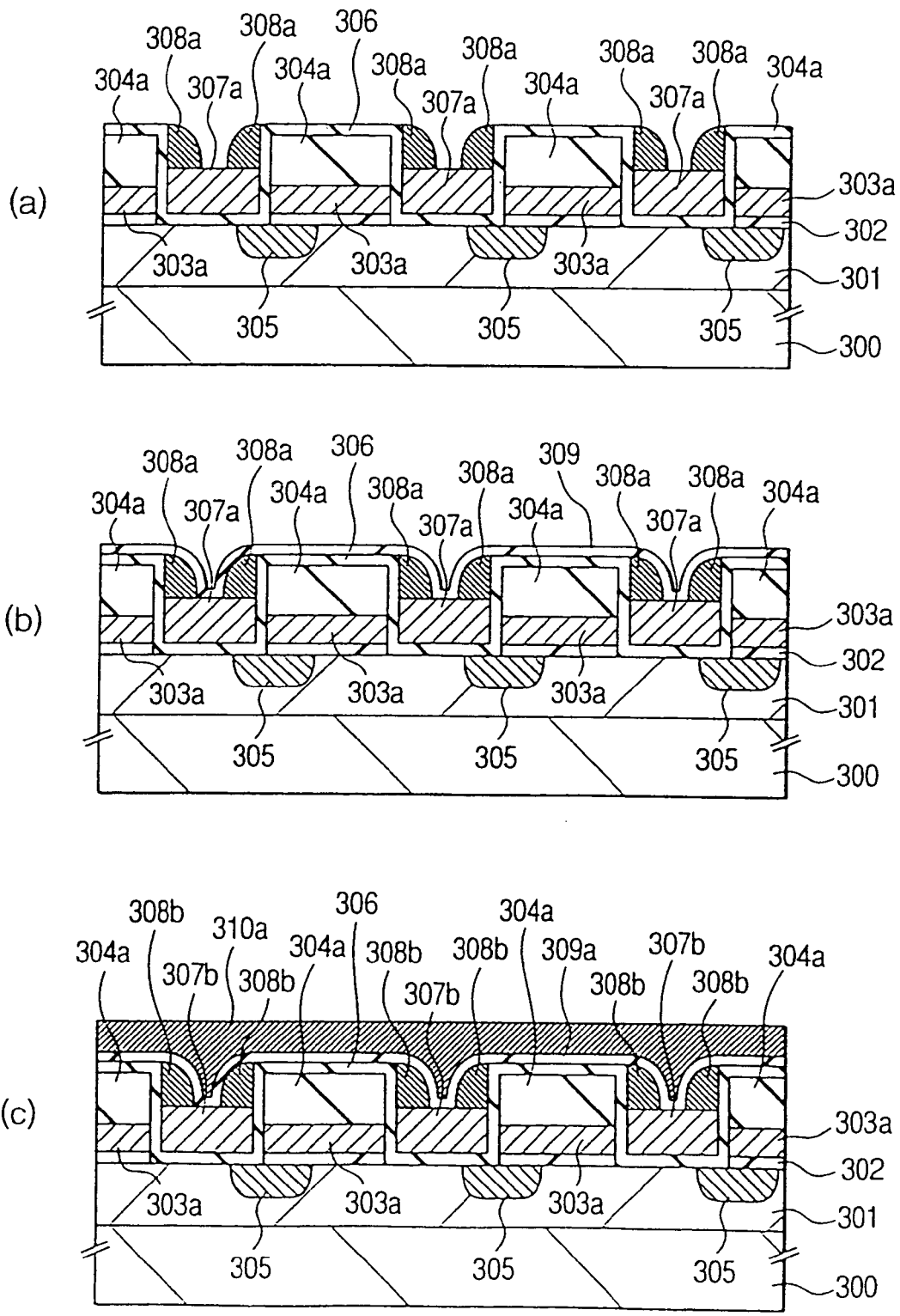
FIGS. 20(a)–(c) cross-sectionally show still further steps of a process for producing a semiconductor integrated circuit device according to Embodiment 7 of the present invention.

FIGS. 18–20 cross-sectionally show steps of a process for producing a semiconductor integrated circuit device according to Embodiment 7 of the present invention. Different from Embodiments 1 to 6, Embodiment 7 shows a case of forming third gates before formation of floating gate patterns. Arrangement of flash memory cells in plan view, and working system are the same as in Embodiment 1 and thus their explanation will be omitted below.

At first, p-type well 301 is formed in silicon substrate 300 and then gate oxide film 302 is formed thereon to a thickness of about 12 nm, for example, by thermal oxidation [FIG. 18(a)].

Then, phosphorus-doped polysilicon film 303 and silicon oxide film to act as third gates are successively deposited thereon [FIG. 18(b)].

Then, said silicon oxide film 304 and polysilicon film 303 are patterned by lithography and dry etching (whereby silicon oxide film and polysilicon film are made into 304a and 303a, respectively) [FIG. 18(c)].

Then, arsenic ions are implanted by tilted ion implantation to form diffusion layers 305 to act as source/drains of memory cells [FIG. 18(d)].

Then, nitrogen-introduced silicon oxide film 306 for isolating floating gates from third gates is formed in the same manner as in FIG. 3(e) of Embodiment 1 [FIG. 19(a)], and phosphorus-doped polysilicon film 307 to act as floating gates is deposited to completely fill the gaps in third gate patterns 303a and 304a [FIG. 19(b)].

Then, polysilicon film 307 is etched back by anisotropic dry etching to leave it in the gaps in third gate patterns 303a and 304a (whereby polysilicon 307 is made into 307a), where an etching amount is so adjusted that the surfaces of polysilicon films 307a are in a higher position than that of the surfaces of polysilicon films 303a [FIG. 19(c)].

Then, phosphorus-doped polysilicon film 308 is deposited thereon [FIG. 19(d)] and then subjected to anisotropic dry etching (whereby polysilicon film 308 is made into 308a) [FIG. 20(a)]. Said polysilicon films 308a are electrically connected to polysilicons 307a, and two layers of these polysilicons form floating gates. Polysilicons 308a are effective for increasing the floating gate surface area and also increasing coupling ratio of memory cells, whereby internal operat-ing voltage during programming/erasing can be reduced.

Then, nitrogen-introduced silicon oxide film 309 for isolating floating gates from word lines is formed thereon to a thickness of 10.5 nm in the same manner as shown in FIG. 3(e) [FIG. 20(b)].

Then, so called polymetal film 310, i.e. a stacked film of a polysilicon film, a tungsten nitride film and a tungsten film, is deposited thereon and patterned by well known lithography and dry etching to form word lines (whereby polymetal film 310 is made into 310a). Furthermore, silicon oxide film 309, and polysilicon films 308a and 307a are successively etched to complete floating gates (whereby polysilicons 308a and 307a are made into 308b and 307b, respectively, and silicon oxide film 309 into 309a) [FIG. 20(c)].

Then, after formation of an intermetal dielectric film, contact holes in communication with word lines 310a, source/drain diffusion layers 305, well 301 and third gates 303a are formed and then a metal film is deposited thereon and patterned to form wirings, thereby completing memory cells, though not shown in drawing.

In memory cells formed according to Embodiment 7, fluctuation in programming/erasing time between bits can be reduced, as compared with Embodiments 1 to 6, because in Embodiment 7 the position of upper surfaces of third gates depends on deposited film thickness of polysilicon film, and thus fluctuation in coupling ratio between the memory cells can be reduced.

Furthermore, filling of the gaps between floating gate patterns 203a by silicon oxide film 208 and flattening by CMP of Embodiments 1 to 5 are not required in Embodiment 7, simplifying process steps.

As in other Embodiments, narrowing of threshold voltage window can be suppressed during the programming in Embodiment 7, as compared with the prior art. Furthermore, changes in threshold voltage after standing can be suppressed and operation can be carried out with a lower voltage. Occurrence of short circuit between the third gates and the floating gates can be also suppressed and memory cell area can be reduced to $4F^2$. Furthermore, program size and programming speed can be increased.

EMBODIMENT 8

Figure 21:
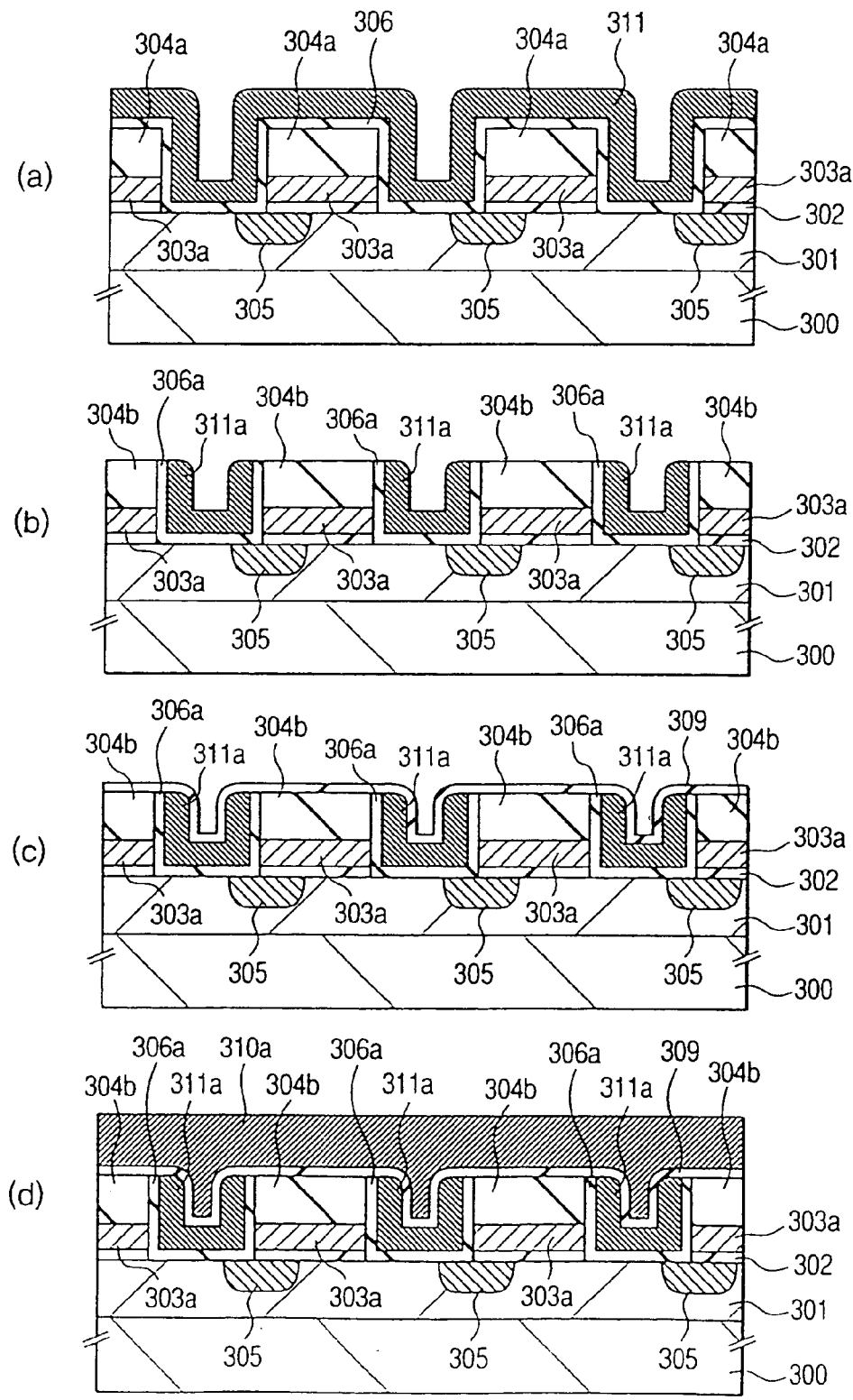
FIGS. 21(a)–(d) cross-sectionally show steps of a process for producing a semiconductor integrated circuit device according to Embodiment 8 of the present invention.

FIG. 21 cross-sectionally shows steps of a process for producing a semiconductor integrated circuit device according to Embodiment 8 of the present invention. The process of Embodiment 8 shows another case of forming third gates before forming a floating gate pattern. Arrangement of flash memory cells in plan view and working system are the same as in Embodiment 1, and thus their explanation will be omitted below.

p-Type well 301, gate oxide film 302, polysilicon films 303a and silicon oxide films 304a are successively formed on silicon substrate 300, and diffusion layers 305 to act as sources/drains of memory cells and nitrogen-introduced silicon oxide film 306 are formed in the same manner as shown in FIG. 18(a) to FIG. 19(a) of Embodiment 7 (not shown in drawing).

Then, phosphorus-doped polysilicon film 311 to act as floating gates is deposited thereon, where, different from Embodiment 7, thickness of polysilicon film 311 is selected so as not to completely fill the gaps in third gate patterns 303a and 304a [FIG. 21(a)].

Then, polysilicon film 311 is removed by polishing, e.g. CMP, until the upper surfaces of silicon oxide films 304a are exposed: (whereby polysilicon film 311 are made into 311a, and silicon oxide films 304a and 306 are made into 304b and 306a, respectively) [FIG. 21(b)]. Here, the polishing is exemplified by CMP, but etching-back may be used, or etching-back may be carried out after filling the gaps with a photo resist, or CMP may be carried out by filling the gaps with a silicon oxide film.

Then, nitrogen-introduced silicon oxide film 310 for isolating floating gates from word lines is formed to a thickness of about 10.5 nm in the same manner as shown in FIG. 3(e) [FIG. 21(c)].

Then, so-called polymetal film 310, i.e. a sacked film of a polysilicon film, a tungsten nitride film, and a tungsten film, is deposited thereon, and patterned by well known lithography and dry etching to form word lines (whereby polymetal film 310 is made into 310a). Furthermore, silicon oxide film 309 is etched to complete floating gates (whereby silicon oxide 309 into 309a) [FIG. 21(d)].

Then, after forming an intermetal dielectric film, contact holes in connection with word lines 310a, source/drain diffusion layers 305, well 301 and third gates 303a are formed, and then a metal film is formed and patterned to form wirings, thereby completing memory cells (not shown in drawing).

In memory cells formed according to Embodiment 8, fluctuation in programming/erasing time between bits can be reduced. Since the floating gates are formed from a single layer of polysilicon, the process steps can be more simplified than those of Embodiment 7.

Furthermore, as in other Embodiments, narrowing of threshold voltage window can be suppressed during the programming in Embodiment 8, as compared with the prior art. Furthermore, changes in threshold voltage after standing can be suppressed and operation can be carried out with a lower voltage. Occurrence of short circuit between the third gates and the floating gates can be also suppressed and memory cell area can be reduced to $4F^2$. Furthermore, program size and programming speed can be increased.

EMBODIMENT 9

Figure 22:
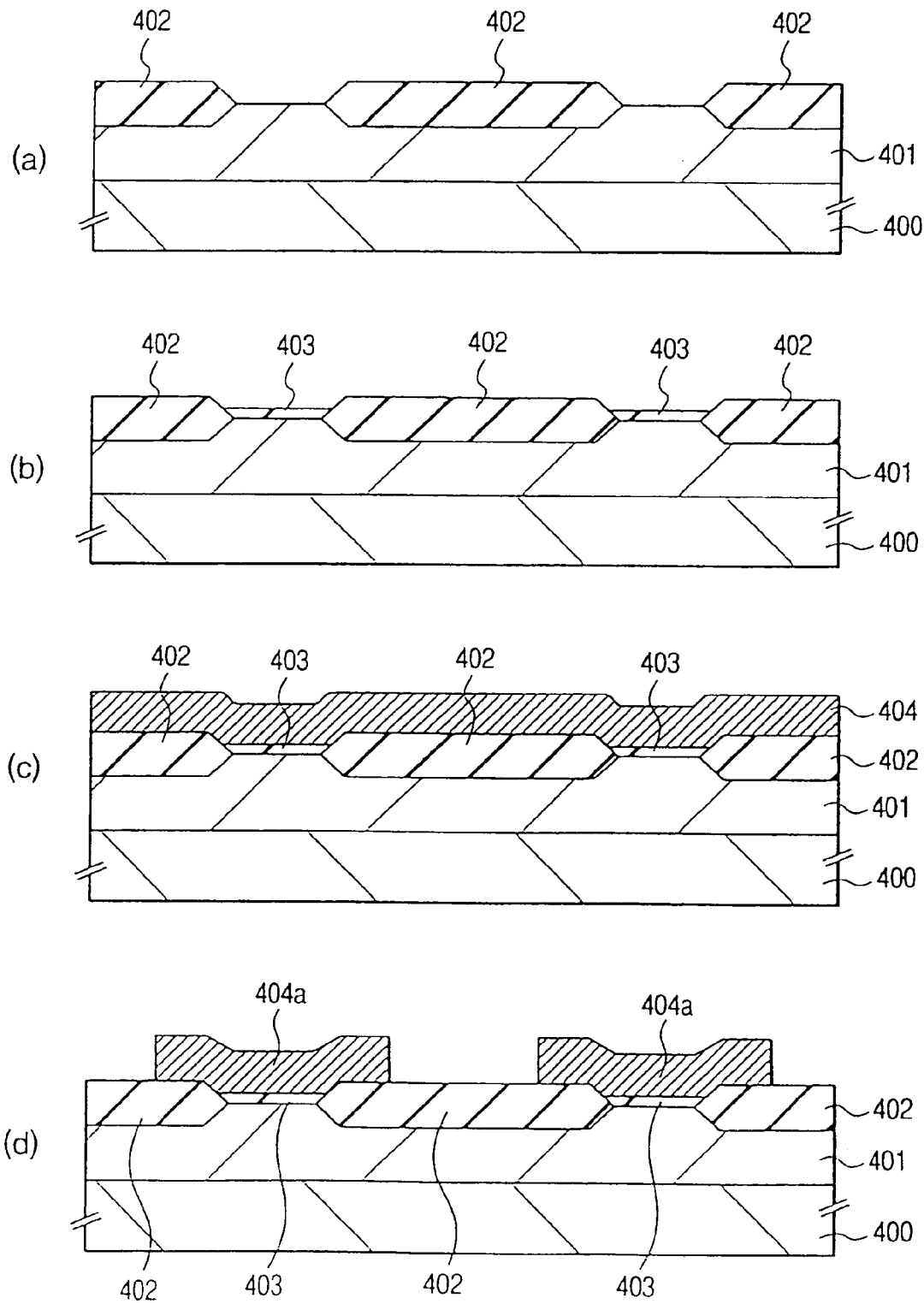
FIGS. 22(a)–(d) cross-sectionally show steps of a process for producing a semiconductor integrated circuit device according to Embodiment 9 of the present invention.
Figure 23:
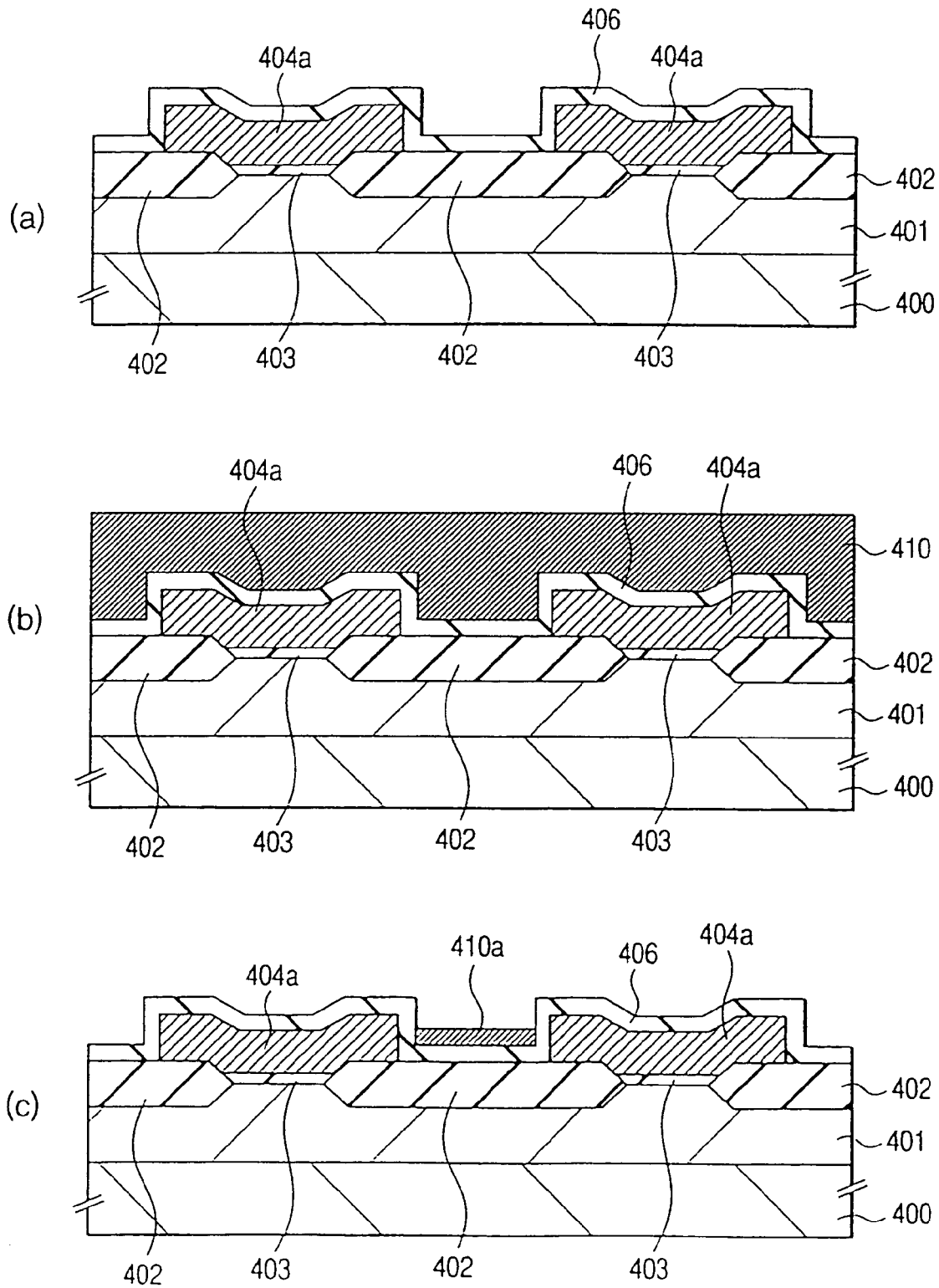
FIGS. 23(a)–(c) cross-sectionally show further steps of a process for producing a semiconductor integrated circuit device according to Embodiment 9 of the present invention.
Figure 24:
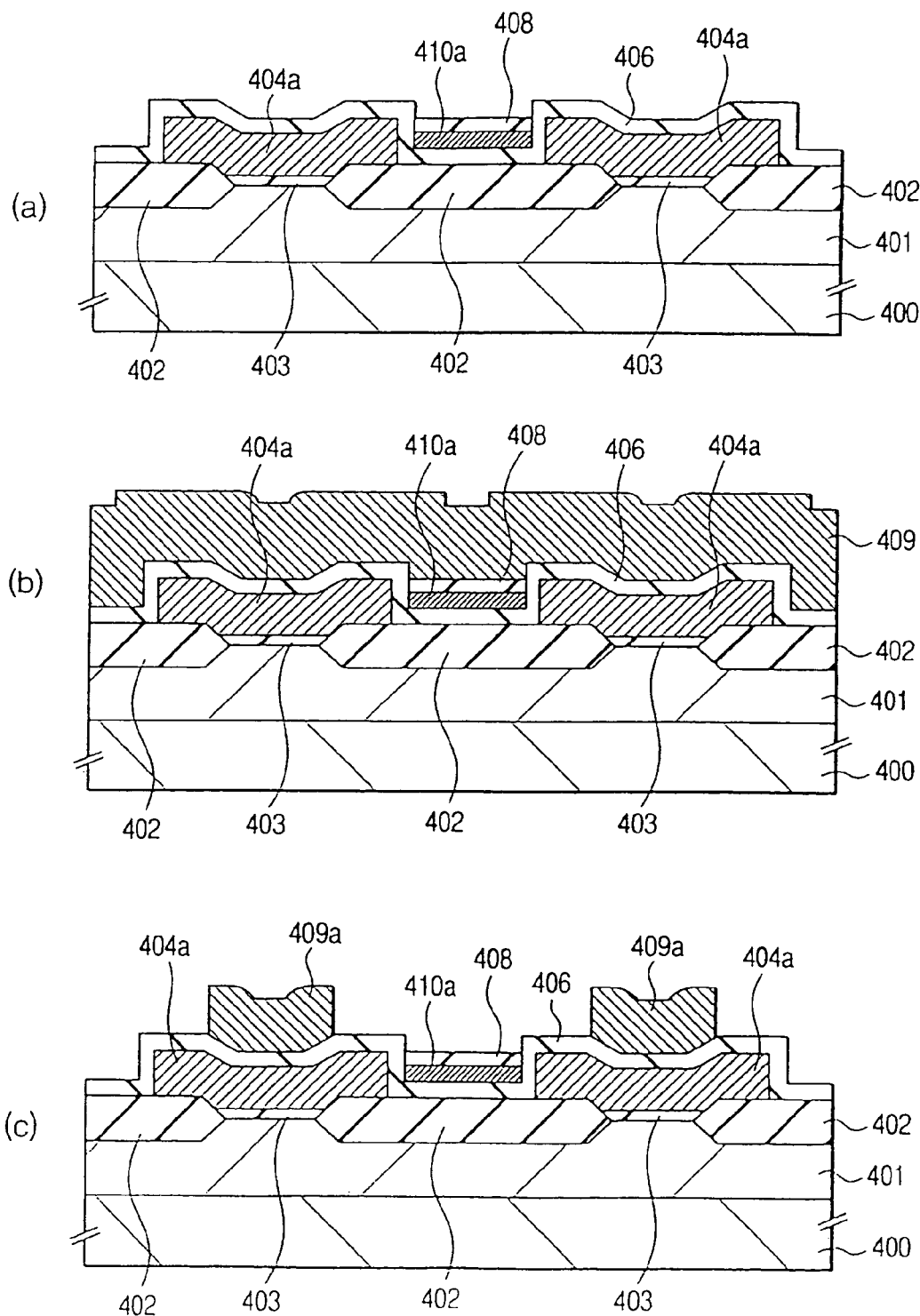
FIGS. 24(a)–(c) cross-sectionally show still further steps of a process for producing a semiconductor integrated circuit device according to Embodiment 9 of the present invention.

FIGS. 22–24 cross-sectionally show steps of a process for producing a semiconductor integrated circuit device according to Embodiment 9 of the present invention.

At first, p-type well 401 is formed in silicon substrate 400, and field oxide film 402 to act as an isolation region is formed thereon [FIG. 22(a)]. Then, gate oxide film 403 is formed by thermal oxidation [FIG. 22(b)].

Then, phosphorus-doped polysilicon film 404 to act as floating gates are deposited thereon [FIG. 22(c)], and patterned by lithography and dry etching to form floating gates (whereby polysilicon film is made into 404a) [FIG. 22(d)].

Then, arsenic ions are implanted therein by ion implantation to form diffusion layers 405 to act as sources/drains of memory cells (not shown in drawing).

Then, insulator film 405 for isolating floating gates from third gates is formed in the same manner as shown in FIG. 3(e) of Embodiment 1 [FIG. 23(a)].

Then, phosphorus-doped polysilicon film 410 to act as third gates are deposited thereon to completely fill the gaps in floating gate patterns 404a [FIG. 23(b)].

Then, polysilicon film 410 is etched back by dry etching so that the upper surface of polysilicon film 410 can be in a lower position than that of upper surfaces of floating gate polysilicons 404a (whereby polysilicon 410 is made into 410a) [FIG. 23(c)].

Then, nitrogen-introduced silicon oxide film 408 for isolating floating gates from word lines is formed in the same manner as shown in FIG. 3(e) of Embodiment 1 [FIG. 24(a)].

Then, so called polymetal film 409, i.e. a stacked film of a polysilicon film, a tungsten nitride film and a tungsten film, is deposited thereon [FIG. 24(b)], and then patterned by lithography and dry etching to form word lines (whereby polymetal film 409 is made into 409a) [FIG. 24(c)].

Then, after forming an intermetal dielectric film, contact holes in communication with word lines 409a, source/drain diffusion layers 405, well 401 and third gates 407a are formed, and then a metal layer is deposited and patterned to form wirings, thereby completing memory cells (not shown in drawing).

In memory cells formed according to Embodiment 9, narrowing of threshold voltage window can be suppressed during programming/erasing cycles, as compared with the prior art. Furthermore, changes in threshold voltage after standing can be suppressed and operation can be carried out with a lower voltage.

According to Embodiment 9, reliability of a semiconductor integrated circuit device after programming/erasing cycles can be effectively improved and internal operating voltage can be effectively reduced.

In the foregoing, the present invention has been described in detail, referring to Embodiments, but the present invention shall not be limited only to the foregoing Embodiments, but, needless to say, can be variously modified within the spirit and the scope of the present invention.

For example, in the foregoing embodiments, a stacked film of a polysilicon film, a tungsten nitride film and a tungsten film is used as materials for word lines, but even other barrier metal films, e.g. films of a transition metal element itself, such as tungsten, titanium, tantalum, etc., or its nitrides, or its silicides, or an aluminum nitride, a cobalt silicide film, a molybdenum silicide film or alloy films such as a titanium-tungsten film, etc. can be used to obtain equivalent effects in place of the tungsten nitride film. Furthermore, even a stacked film of a polysilicon film and a metal silicide film, i.e. so-called polycide film, can have an equivalent effect. Typical example of the metal silicide film is a tungsten silicide film. Even a polysilicon monolayer film has an equivalent effect.

In the foregoing Embodiments, a nitrogen-introduced silicon oxide film is used as an insulator film for isolating floating gates from third gates, but when the present non-volatile semiconductor memory device is applied to products of less programming/erasing cycles, a silicon oxide film formed by conventional thermal oxidation or CVD may be used.

In the foregoing Embodiments, a nitrogen-introduced silicon oxide film is also used as an insulator film for isolating floating gates from control gates, but when the device is applied to cases where the internal operating voltage during the programming/erasing or programming/erasing speed is not so important, a so far widely used stack film of silicon oxide film/silicon nitride film/silicon oxide film, i.e. a so-called ONO film may be used as the insulator film.

In the foregoing Embodiments, description has been made of n-channel type memory cells, in which n-type diffusion layers are formed in p-type well, but p-channel type memory cells, in which the diffusion layers are of p-type, have an equivalent effect. In that case, voltages of control gates, third gates and drains during the programming/erasing will be negative, relative to the well voltage. In that case, electron injection is made by hot electrons.

In the foregoing Embodiments, the third gates have both functions of gates for controlling split channels and of erase gates during the programming/erasing, but may have any one of the functions.

INDUSTRIAL APPLICABILITY

In the foregoing Embodiments, necessary levels of electrons injected into floating gates during programming/erasing are minimum two, but the present invention may be applied to so-called multilevel storage of forming at least 4 levels and storing at least 2 bits in one memory cell. In the conventional multilevel storage, there has been a problem of a larger difference between the lowest threshold voltage level and the highest threshold voltage level, as compared with two-level storage, even if the amount of electrons injected into the floating gates is precisely controlled to compress the threshold voltage distribution on the respective levels. Thus, in the Fowler-Nordheim type programming/erasing, there has been such a problem that the programming/erasing speed is retarded or the programming/erasing voltage is increased. In the present invention, programming and erasing can be carried out with a lower voltage such as 13.5 V or lower. In other words, the programming/erasing can be carried out at a higher speed, and thus the present invention is very effective for the multi-level storage system.

Furthermore, the present invention can be widely applied to semiconductor devices provided with a memory cell array having an non-volatile semiconductor memory device, e.g. one-chip microcomputers, system LSI, etc.

Typical effects of the present invention can be summarized as follows: improved reliability of a semiconductor integrated circuit device after programming/erasing cycles; reduced internal operating voltage of a semiconductor integrated circuit device; improved yield of a semiconductor integrated circuit device; reduced memory cell area of a semiconductor integrated circuit device; and improved operating speed of a semiconductor integrated circuit device.

The invention claimed is:

1. A process for producing a nonvolatile memory device, which comprises the steps of:
   forming third gates on a first insulator film disposed on a silicon substrate;
   forming a second insulator film covering the third gates;
   forming a first pattern to act as floating first gates in gaps formed between the third gates; and
   forming control second gates above the floating first gates and the third gates, the height of the upper surfaces of the third gates thus formed being made lower than that of the upper surface of the first pattern,
   wherein in the forming of the third gates, a plurality of third gates are formed in a stripe shape and are formed parallel to each other,
   and wherein in the forming of the first pattern, the floating first gates and the third gates are formed so as to be provided alternately.

2. A process according to claim 1, wherein the first pattern is formed by any one of the following methods:
   a first method including forming a polysilicon film to completely fill the gaps, and dry etching the polysilicon film;
   a second method including forming a polysilicon film to completely fill the gaps, and polishing the poly-silicon film by chemical mechanical polishing, followed by dry etching;
   a third method including forming a polysilicon film so as not to completely fill the gaps, and polishing the polysilicon film by chemical mechanical polishing;
   a fourth method including forming a polysilicon film so as not to completely fill The gaps, forming a photoresist film to fill the gaps, and dry etching the photoresist film and the polysilicon film; and
   a fifth method including forming a polysilicon film so as not to completely fill the gaps, depositing a silicon oxide film to fill the gaps, and polishing the silicon oxide film and the polysilicon film by chemical mechanical polishing.

3. A process according to claim 1, wherein the third gates are self-aligned to the first gates.

4. A process according to claim 1, wherein the first gates are self-aligned to the third gates.

* * * * *